United States Patent
Nikipelov et al.

(10) Patent No.: US 12,271,008 B2
(45) Date of Patent: Apr. 8, 2025

(54) TRANSMISSIVE DIFFUSOR

(71) Applicant: ASML NETHERLANDS B.V., Veldhoven (NL)

(72) Inventors: Andrey Nikipelov, Eindhoven (NL); Marcus Adrianus Van De Kerkhof, Helmond (NL); Pieter-Jan Van Zwol, Eindhoven (NL); Laurentius Cornelius De Winter, Vessem (NL); Wouter Joep Engelen, Eindhoven (NL); Alexey Olegovich Polyakov, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 830 days.

(21) Appl. No.: 17/282,559

(22) PCT Filed: Sep. 13, 2019

(86) PCT No.: PCT/EP2019/074447
§ 371 (c)(1),
(2) Date: Apr. 2, 2021

(87) PCT Pub. No.: WO2020/078625
PCT Pub. Date: Apr. 23, 2020

(65) Prior Publication Data
US 2021/0382209 A1    Dec. 9, 2021

(30) Foreign Application Priority Data

Oct. 16, 2018  (EP) ..................... 18200620
Mar. 22, 2019  (EP) ..................... 19164614

(51) Int. Cl.
*G02B 5/02*     (2006.01)
*G03F 7/00*     (2006.01)
*B82Y 40/00*    (2011.01)

(52) U.S. Cl.
CPC ......... *G02B 5/0278* (2013.01); *G03F 7/7015* (2013.01); *G03F 7/70241* (2013.01); *B82Y 40/00* (2013.01)

(58) Field of Classification Search
CPC .... G02B 5/0278; G02B 5/021; G02B 5/0236; G02B 1/02; G02B 5/0247;
(Continued)

(56) References Cited

U.S. PATENT DOCUMENTS 6,010,747 A  *  1/2000  Beeson ............. G02F 1/133524
                                                    427/164
6,208,466 B1 *  3/2001  Liu ..................... G02B 5/0252
                                                    359/590

(Continued)

FOREIGN PATENT DOCUMENTS

CN    103048709    4/2013
JP    5821397      11/2015
(Continued)

OTHER PUBLICATIONS

Yu, X. et al.: "Coalescence and percolation in thin metal-films", Phys.Rev.B 44(23), 13163-13166 (1991).

(Continued)

*Primary Examiner* — Mustak Choudhury
(74) *Attorney, Agent, or Firm* — Pillsbury Winthrop Shaw Pittman, LLP

(57) ABSTRACT

A first diffusor configured to receive and transmit radiation has a plurality of layers, each layer arranged to change an angular distribution of EUV radiation passing through it differently. A second diffusor configured to receive and transmit radiation has a first layer and a second layer. The first layer is formed from a first material, the first layer including a nanostructure on at least one surface of the first layer. The second layer is formed from a second material (Continued)

adjacent to the at least one surface of the first layer such that the second layer also includes a nanostructure. The second material has a refractive index that is different to a refractive index of the first layer. The diffusors may be configured to receive and transmit EUV radiation.

29 Claims, 10 Drawing Sheets

(58) Field of Classification Search
CPC .............. G02B 2207/101; G03F 7/7015; G03F 7/70241; G03F 7/7085; G03F 9/7046; G03F 9/7088; G03F 7/706; B82Y 40/00
See application file for complete search history.

(56) References Cited

U.S. PATENT DOCUMENTS

| | | | |
|---|---|---|---|
| 9,235,662 B2 | 1/2016 | Liu | |
| 10,401,734 B2 | 9/2019 | Voogd et al. | |
| 2006/0109533 A1* | 5/2006 | Schriever | G02B 5/0278 359/15 |
| 2016/0103390 A1 | 4/2016 | Fujimura et al. | |

FOREIGN PATENT DOCUMENTS

| | | | |
|---|---|---|---|
| TW | 201337472 | 9/2013 | |
| TW | 201414996 | 4/2014 | |
| TW | 201531798 | 8/2015 | |
| TW | 201712441 | 4/2017 | |
| WO | 2017207512 | 12/2017 | |
| WO | WO-2017207512 A2 * | 12/2017 | ............. G02B 5/021 |

OTHER PUBLICATIONS

Duran, J. et al.: "Fabrication of ultrahigh aspect ratio silicon nanostructures using self-assembled gold metal-assisted chemical etching", J. Micro/Nanolith. MEMS MOEMS 16(1), 014502 (2017).

Van de Kerkhof, M. et al.: "Diffuser concepts for in-situ wavefront measurement of EUV projection optics", Proc. of SPIE, vol. 10583 (Mar. 19, 2018).

International Search Report and Written Opinion issued in corresponding PCT Patent Application No. PCT/EP2019/074447, dated Jan. 20, 2020.

* cited by examiner

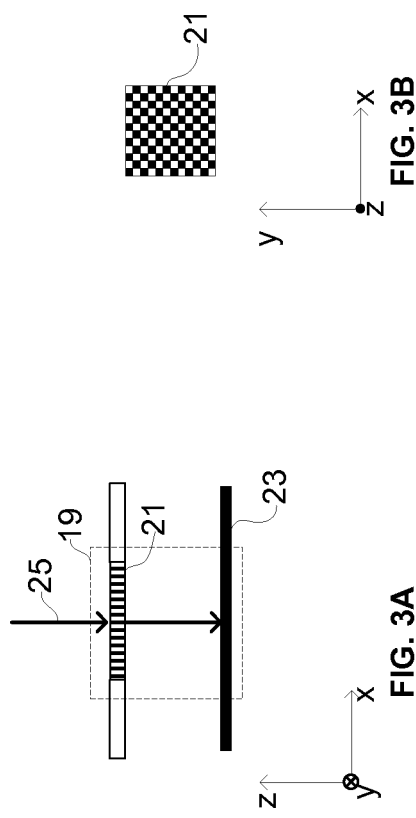
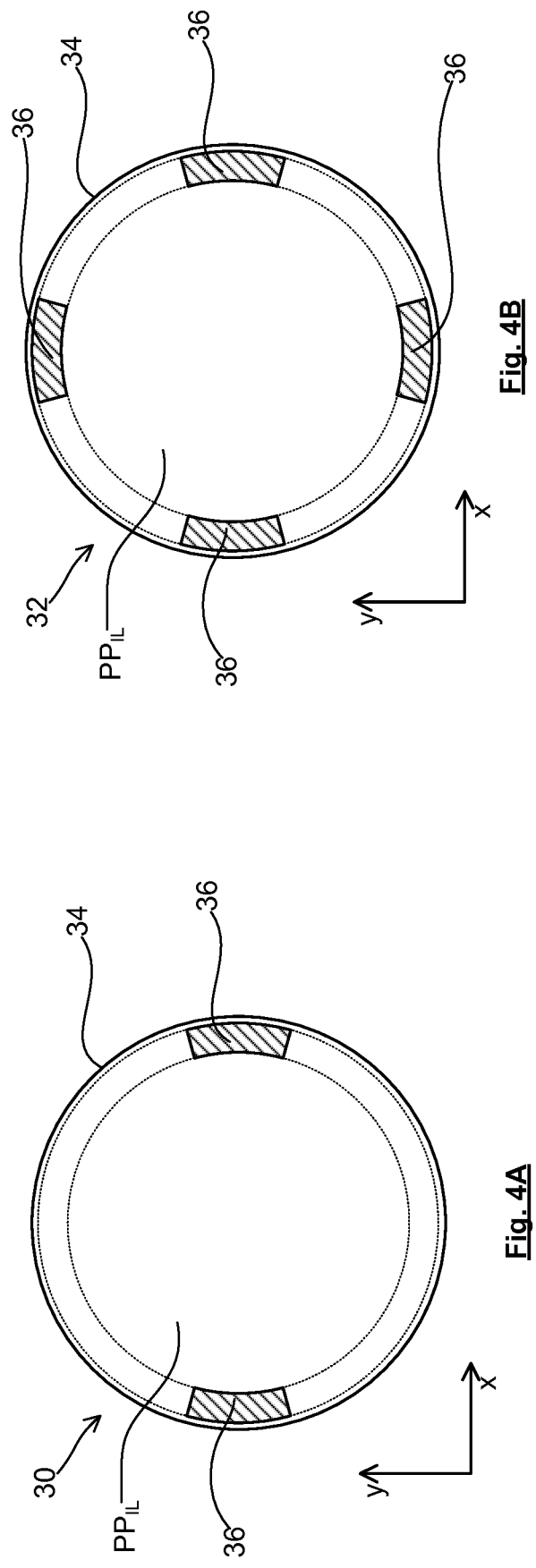

TRANSMISSIVE DIFFUSOR

CROSS-REFERENCE TO RELATED APPLICATIONS

This application is the U.S. national phase entry of PCT Patent Application No. PCT/EP2019/074447 which was filed on Sep. 13, 2019, which claims the benefit of priority of European Patent Application No. 18200620.5 which was filed on Oct. 16, 2018 and of European Patent Application No. 19164614.0 which was filed on Mar. 22, 2019, each of which is incorporated herein in its entirety by reference.

FIELD

The present invention relates to transmissive diffusors, i.e. diffusors configured to receive and transmit radiation, the transmitted radiation having an altered angular distribution. The diffusors may be suitable for use with EUV radiation and may form part of a measurement system within an EUV lithography apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

It is known for lithographic apparatus to comprise measurement systems for determining one or more pupil function variations. Pupil function variations may comprise: relative phase variations within the pupil plane and/or relative intensity variations within the pupil plane. Such measurement systems typically comprise an object level patterning device (for example a diffraction grating or pinhole or the like); an illumination system; and an image level sensor apparatus. The illumination system is arranged to illuminate the patterning device with radiation. At least a portion of the radiation scattered by the patterning device is received by the projection system (whose properties are being measured) which is arranged to form an image of the patterning device on the image level sensor apparatus. It is desirable for such measurement systems that the entire entrance pupil of the projection system receives radiation from the patterning device. However, the illumination system is typically also used by a lithographic apparatus for forming a (diffraction limited) image of an object level reticle or mask on an image level substrate (e.g. a resist coated silicon wafer) wherein it may be desirable to only illuminate one or more discrete portions of the entrance pupil of the projection system.

It may be desirable to provide a mechanism whereby an angular distribution of an illumination beam that would otherwise illuminate one or more discrete portions of the entrance pupil of the projection system can be altered such that the entire entrance pupil of the projection system can receive radiation from the patterning device.

SUMMARY

According to a first aspect of the invention there is provided a diffusor configured to receive and transmit radiation, wherein the diffusor comprises: a plurality of layers, each layer arranged to change an angular distribution of radiation passing through it differently.

The diffusor may be configured to receive and transmit EUV radiation.

The diffusor according to the first aspect of the invention may, for example, form part of an EUV lithographic apparatus. For example, the diffusor may be used in, or form part of, a measurement system for determining an aberration map or a relative intensity map for a projection system. Advantageously, by providing a plurality of layers, each layer being arranged to change an angular distribution of EUV radiation passing through it differently, the diffusor provides an arrangement whereby an EUV radiation beam can be more efficiently diffused over a desired range of angles. In addition, the plurality of layers which change the angular distribution of the EUV radiation passing through it differently provides more control over the angular distribution of the radiation exiting the diffusor.

At least two of the plurality of layers may predominantly cause angular dispersion of EUV radiation passing through it in a single scattering direction in a plane of the diffusor, and the scattering directions of the at least two layers may be different.

The plane of the diffusor may be referred to generally as the x-y plane. A propagation direction of radiation through the diffusor may be generally perpendicular to the plane of the diffusor and may be referred to generally as the z-direction. In one example embodiment, the diffusor may comprise two layers: a first layer arranged to cause angular dispersion in the x-direction; and a second layer arranged to cause angular dispersion in the y-direction.

At least two of the plurality of layers may cause different amounts of angular dispersion of EUV radiation passing through them in their respective scattering directions.

Advantageously, this can allow the amount of dispersion to be tailored for a particular purpose.

For example, as previously discussed, the diffusor may be used in, or form part of, a measurement system for determining an aberration map or a relative intensity map for a projection system of a lithographic apparatus. In such a lithographic apparatus, an illumination system is typically used to illuminate an object level reticle or mask and a projection system is used to form a (diffraction limited) image of on an image level substrate (e.g. a resist coated silicon wafer). Typically the projection system may apply a reduction factor so as to form an image with features that are smaller than corresponding features on object level reticle or mask. In some systems, the projection system may have an anamorphic design whereby different reduction factors are applied in two orthogonal directions. With such a design, the numerical aperture may be represented by an ellipse in the entrance pupil of the projection system (as opposed to a circle). With such an anamorphic projection system it may be desirable to provide a diffusor with, for example, more diffusion in a direction that corresponds to a major axis of this ellipse and less diffusion in a direction that corresponds to a minor axis of this ellipse. This can be achieved by using two layers which each causes different amounts of angular dispersion of EUV radiation in their respective (mutually perpendicular) scattering directions.

At least one of the plurality of layers may comprise a layer of scattering material with a nanostructure provided on at least one surface thereof.

Such an arrangement is particularly advantageous for use with EUV radiation (which may, for example, have a wavelength of 13.5 nm) because such a nanostructure comprises features with a dimension that is comparable to, or smaller than, the wavelength of the radiation that it is desired to diffuse. Under these conditions, the scattering is in the Mie-scattering regime, and significant angular dispersion can be achieved.

The nanostructure may comprise features with a dimension in the range 2-10 nm.

Features of this size or smaller may result in an angular divergence for EUV radiation of order of 10°, for example or the order of 7°. For example, features of this size or smaller may result in the angular scattering distribution in at least one scattering direction having a width of 5° or greater. This may ensure that substantially the entire pupil plane is filled with radiation for a lithography apparatus having a projection system with a numerical aperture of the order of 0.08.

The diffusor may be configured such that the angular scattering distribution in at least one scattering direction has a width of 5° or greater.

It will be appreciated that as used here, width may mean the full width at half maximum (FWHM) of the angular scattering distribution.

The scattering material may have a refractive index n and the magnitude of (1-n) may be greater than a threshold value of 0.06.

It will be appreciated that the diffusor according to the first aspect of the invention is a transmissive diffusor for use with EUV radiation. Due to the strong absorption of EUV radiation by most materials, EUV optical systems typically comprise reflective optics (rather than refractive lenses) in vacuum. In general, in order to maximise the angular dispersion of the EUV radiation it is desirable to maximize the optical contrast between the material from which the scattering nanostructure is formed and vacuum, i.e. it is desirable to maximize the absolute value of (1-n).

In some embodiments, the magnitude of (1-n) is greater than a threshold value of 0.08. In some embodiments, the magnitude of (1-n) is greater than a threshold value of 0.1. In some embodiments, the magnitude of (1-n) is greater than a threshold value of 0.12.

The scattering material may have an extinction coefficient k for EUV radiation less than a threshold value of 0.04 $nm^{-1}$.

It will be appreciated that the diffusor according to the first aspect of the invention is a transmissive diffusor for use with EUV radiation. In general, in order to maximise the intensity of the EUV radiation which is output by the diffusor it is desirable to minimize the attenuation caused by the scattering material. This can be done by minimizing the extinction coefficient of the scattering material and/or minimizing the thickness of the scattering material.

In some embodiments, the magnitude of the extinction coefficient k for EUV radiation is less than a threshold value of 0.03 $nm^{-1}$. In some embodiments, the magnitude of the extinction coefficient k for EUV radiation is less than a threshold value of 0.02 $nm^{-1}$. In some embodiments, the magnitude of the extinction coefficient k for EUV radiation is less than a threshold value of 0.01 $nm^{-1}$.

It will be understood that, for a given scattering material, in order to increase the amount of angular dispersion it is desirable to increase the thickness of the layer(s) whereas in order to reduce the attenuation caused by the scattering material it is desirable to decrease the thickness of the layer(s). Having a scattering material for which the magnitude of (1-n) is large allows the thickness to be reduced (while still providing reasonable angular dispersion). Having a scattering material with a small extinction coefficient k for EUV radiation allows the thickness to be increased (while still providing reasonable transmission).

It will therefore be appreciated that, in practice, a suitable material may be selected balancing these two requirements.

In some embodiments, the magnitude of (1-n) is greater than a threshold value of 0.06 and the magnitude of the extinction coefficient k for EUV radiation is less than a threshold value of 0.01 $nm^{-1}$.

In some embodiments, the magnitude of (1-n) is greater than a threshold value of 0.08 and the magnitude of the extinction coefficient k for EUV radiation is less than a threshold value of 0.02 $nm^{-1}$.

In some embodiments, the magnitude of (1-n) is greater than a threshold value of 0.1 and the magnitude of the extinction coefficient k for EUV radiation is less than a threshold value of 0.03 $nm^{-1}$.

In some embodiments, the magnitude of (1-n) is greater than a threshold value of 0.12 and the magnitude of the extinction coefficient k for EUV radiation is less than a threshold value of 0.04 $nm^{-1}$.

The scattering material may have a refractive index n and an extinction coefficient k for EUV radiation and the ratio of the magnitude of (1-n) to (k+0.025) may be greater than a threshold value of 2.

The scattering material may comprise one of the following: molybdenum, ruthenium, niobium, rhodium or technetium.

The scattering material may have a thickness arranged to cause a phase shift of $(2m+1)\pi$ radians for EUV radiation propagating across the thickness of the scattering material. It will be appreciated that m is an integer.

Advantageously, this suppresses zero-order (or specular) scattering. It will be appreciated that the phase shift caused by propagating through the scattering material is $2\pi/\lambda$ multiplied by the change in optical path length that results from the scattering material, where $\lambda$ is the wavelength of the EUV radiation. If the scattering material is immersed in an optical medium having a refractive index of $n_2$ then the change in optical path length that results from the scattering material is given by $(n-n_2) \cdot t$, where t is the thickness of the scattering material.

For example, for an embodiment wherein the scattering material comprises molybdenum (with a refractive index of approximately 0.92) in vacuum (i.e. $n_2=1$), a phase shift of $\pi$ radians may be achieved for EUV radiation with a wavelength of 13.5 nm if the thickness of the material is approximately 85 nm.

The layer of scattering material may be adjacent a layer of support material, and the support material may have a nanostructure provided on at least one surface thereof.

The support material may have a refractive index close to 1 for EUV radiation and a relatively low absorption coefficient for EUV radiation. For example, the first material may comprise silicon or carbon. Such materials may be considered to be relatively optically neutral for EUV radiation.

The layer of support material may comprise a membrane formed from carbon nanotubes.

The layer of support material may comprise porous silicon.

According to a second aspect of the invention there is provided a diffusor configured to receive and transmit radiation, wherein the diffusor comprises: a first layer formed from a first material, the first layer comprising a nanostructure on at least one surface of the first layer; and a second layer formed from a second material adjacent to the at least one surface of the first layer such that the second layer also comprises a nanostructure, the second material having a refractive index that is different to a refractive index of the first layer.

The diffusor may be configured to receive and transmit EUV radiation.

The diffusor according to the second aspect of the invention may, for example, form part of an EUV lithographic apparatus. For example, the diffusor may be used in, or form part of, a measurement system for determining an aberration map or a relative intensity map for a projection system. By forming the diffusor from two layers, the first layer (which may be referred to as a support layer) may be used to impart a nanostructure to the second layer (which may be referred to as a scattering layer).

Since the second material has a refractive index that is different to a refractive index of the first layer, the first layer may be formed from a material that is relatively optically neutral for EUV radiation (for example having a refractive index close to 1 for EUV radiation and a relatively low absorption coefficient for EUV radiation) whereas the second layer can be formed from a material with suitable optical properties so as to achieve a desired angular dispersion of EUV radiation passing therethrough. For example, the first material may comprise silicon or carbon. Such materials may be considered to be relatively optically neutral for EUV radiation.

Providing (via the second layer) a layer of material that causes scattering and has a nanostructure formed thereon is particularly advantageous for use with EUV radiation (which may, for example, have a wavelength of 13.5 nm) because such a nanostructure comprises features with a dimension that is comparable to, or smaller than, the wavelength of the radiation that it is desired to diffuse. Under these conditions, the scattering is in the Mie-scattering regime, and significant angular dispersion can be achieved.

It will be appreciated that although the second layer may be said to be adjacent to the at least one surface of the first layer, in general the second layer will extend at least partially into the first layer. In some embodiments, the second layer may extend, a least in some positions in a plane of the diffusor, through the entire first layer.

The nanostructure may comprise features with a dimension in the range 2-10 nm.

Features of this size or smaller may result in an angular divergence for EUV radiation of order of 10°, for example or the order of 7°. For example, features of this size or smaller may result in the angular scattering distribution in at least one scattering direction having a width of 5° or greater. This may ensure that substantially the entire pupil plane is filled with radiation for a lithography apparatus having a projection system with a numerical aperture of the order of 0.08.

The diffusor may be configured such that the angular scattering distribution in at least one scattering direction has a width of 5° or greater.

It will be appreciated that as used here, width may mean the full width at half maximum (FWHM) of the angular scattering distribution.

The first layer may comprise a membrane formed from carbon nanotubes.

The first layer may comprise porous silicon.

The first layer may comprise a support material which has been selectively etched to form the nanostructure. The support material may, for example, comprise silicon or porous silicon.

A layer of metal may be provided on parts of the support material which have not been selectively etched.

The layer of metal may comprise a self-assembled metal structure. The self-assembled metal structure may be formed from, for example, gold. The self-assembled metal structure may be formed by physical vapour deposition (PVD).

The second material may have a refractive index n and the magnitude of (1-n) may be greater than a threshold value of 0.06.

It will be appreciated that the diffusor according to the second aspect of the invention is a transmissive diffusor for use with EUV radiation. Due to the strong absorption of EUV radiation by most materials, EUV optical systems typically comprise reflective optics (rather than refractive lenses) in vacuum. In general, in order to maximise the angular dispersion of the EUV radiation it is desirable to maximize the optical contrast between the material from which the scattering nanostructure is formed and vacuum, i.e. it is desirable to maximize the absolute value of (1-n).

In some embodiments, the magnitude of (1-n) is greater than a threshold value of 0.08. In some embodiments, the magnitude of (1-n) is greater than a threshold value of 0.1. In some embodiments, the magnitude of (1-n) is greater than a threshold value of 0.12.

The second material may have an extinction coefficient k for EUV radiation less than a threshold value of 0.04 $nm^{-1}$.

It will be appreciated that the diffusor according to the second aspect of the invention is a transmissive diffusor for use with EUV radiation. In general, in order to maximise the intensity of the EUV radiation which is output by the diffusor it is desirable to minimize the attenuation caused by the second material (which may be referred to as the scattering material). This can be done by minimizing the extinction coefficient of the scattering material and/or minimizing the thickness of the scattering material.

In some embodiments, the magnitude of the extinction coefficient k for EUV radiation is less than a threshold value of 0.03 $nm^{-1}$. In some embodiments, the magnitude of the extinction coefficient k for EUV radiation is less than a threshold value of 0.02 $nm^{-1}$. In some embodiments, the magnitude of the extinction coefficient k for EUV radiation is less than a threshold value of 0.01 $nm^{-1}$.

It will be understood that, for a given scattering material, in order to increase the amount of angular dispersion it is desirable to increase the thickness of the layer(s) whereas in order to reduce the attenuation caused by the scattering material it is desirable to decrease the thickness of the layer(s). Having a scattering material for which the magnitude of (1-n) is large allows the thickness to be reduced (while still providing reasonable angular dispersion). Having a scattering material with a small extinction coefficient k for EUV radiation allows the thickness to be increased (while still providing reasonable transmission).

It will therefore be appreciated that, in practice, a suitable material may be selected balancing these two requirements.

In some embodiments, the magnitude of (1-n) is greater than a threshold value of 0.06 and the magnitude of the extinction coefficient k for EUV radiation is less than a threshold value of 0.01 $nm^{-1}$.

In some embodiments, the magnitude of (1-n) is greater than a threshold value of 0.08 and the magnitude of the extinction coefficient k for EUV radiation is less than a threshold value of 0.02 nm$^{-1}$.

In some embodiments, the magnitude of (1-n) is greater than a threshold value of 0.1 and the magnitude of the extinction coefficient k for EUV radiation is less than a threshold value of 0.03 nm$^{-1}$.

In some embodiments, the magnitude of (1-n) is greater than a threshold value of 0.12 and the magnitude of the extinction coefficient k for EUV radiation is less than a threshold value of 0.04 nm$^{-1}$.

The second material may have a refractive index n and an extinction coefficient k for EUV radiation and the ratio of the magnitude of (1-n) to (k+0.025) may be greater than a threshold value of 2.

The second material may comprise one of the following: molybdenum, ruthenium, niobium, rhodium or technetium.

The diffusor may have a thickness arranged to cause a phase shift of (2m+1)π radians for EUV radiation propagating across the thickness of the diffusor. It will be appreciated that m is an integer.

Advantageously, this suppresses zero-order (or specular) scattering.

The phase shift caused by propagating through the diffusor may be predominantly caused by the scattering material.

It will be appreciated that the phase shift caused by propagating through the scattering material is 2π/λ multiplied by the change in optical path length that results from the scattering material, where λ is the wavelength of the EUV radiation. If the scattering material is immersed in an optical medium having a refractive index of $n_2$ then the change in optical path length that results from the scattering material is given by $(n-n_2) \cdot t$, where t is the thickness of the scattering material.

For example, for an embodiment wherein the scattering material comprises molybdenum (with a refractive index of approximately 0.92) in vacuum (i.e. $n_2=1$), a phase shift of π radians may be achieved for EUV radiation with a wavelength of 13.5 nm if the thickness of the material is approximately 85 nm.

According to a third aspect of the invention there is provided a diffusor configured to receive and transmit EUV radiation, wherein the diffusor comprises: a support layer formed from a first material; and a layer of nanoparticles supported by the support layer, the nanoparticles being formed from a material that is transmissive for EUV radiation and causes refraction of EUV radiation incident on the diffusor.

The diffusor according to the third aspect of the invention may, for example, form part of an EUV lithographic apparatus. For example, the diffusor may be used in, or form part of, a measurement system for determining an aberration map or a relative intensity map for a projection system.

The layer of nanoparticles can act as a random array of microlenses, causing scattering of EUV radiation that is incident on the diffusor. The layer of nanoparticles may be considered to form a nanostructure. This is particularly advantageous for use with EUV radiation (which may, for example, have a wavelength of 13.5 nm) because such a nanostructure can comprise features with a dimension that is comparable to, or smaller than, the wavelength of the radiation that it is desired to diffuse. Under these conditions, the scattering is in the Mie-scattering regime, and significant angular dispersion can be achieved.

By arranging the diffusor such that an EUV radiation beam is incident on it at an oblique angle, the amount of dispersion to be tailored for a particular purpose. With such an arrangement, the amount of dispersion will be different in the plane of incidence and in a plane perpendicular to the plane of incidence.

As previously discussed, the diffusor may be used in, or form part of, a measurement system for determining an aberration map or a relative intensity map for a projection system of a lithographic apparatus. In some such systems, the projection system may have an anamorphic design whereby different reduction factors are applied in two orthogonal directions. With such an anamorphic projection system it may be desirable to provide a diffusor which is arranged, for example, to provide more diffusion in one direction and less diffusion in another perpendicular direction. This can be achieved by suitable orientation of the diffusor.

The nanoparticles may be formed from any materials with suitable optical properties so as to achieve a desired angular dispersion of EUV radiation passing therethrough.

A ratio of an average dimension of the nanoparticles to an average displacement of adjacent nanoparticles may be in the range 1 to 2.

It will be appreciated that as used herein a dimension of a nanoparticle may mean a diameter D of that nanoparticle. It will be appreciated that as used herein a displacement of two adjacent nanoparticles may mean a distance Q, in a plane of the diffusor, between a centre of one of the nanoparticles a centre of the other nanoparticle. By arranging the nanoparticles within the layer of nanoparticles such that the ratio of the average dimension $D_{av}$ of the nanoparticles to an average displacement $Q_{av}$ of adjacent nanoparticles is in the range 1 to 2 the diffusor may approximate diffusors that are based on quasi-random diffractive structures (having a range of heights, pitches and/or widths).

The nanoparticles may comprise a noble metal such as ruthenium (Ru) or rhodium (Rh).

Alternatively, the nanoparticles may be formed from yttrium (Y), zirconium (Zr), molybdenum (Mo) or diamond. Alternatively, the nanoparticles may be formed from a ceramic based on any of the following: ruthenium, rhodium, yttrium, zirconium, molybdenum or carbon, in combination with any of the following: boron (B), nitrogen (N), oxygen (O) or carbon (C).

Optionally, for embodiments wherein the nanoparticles are formed from a non-noble metal, that material may be encapsulated in a shell formed from a noble metal such as, for example, ruthenium or rhodium. The thickness of such a shell may be <R/2, where R is the radius of the nanoparticle. Such a shell of noble metal improves robustness of the nanoparticles to the environment, which may comprise an EUV plasma.

The nanoparticles may comprise an outer shell of material formed from SiO2, ZrO2, Y2O3 or other oxide, boride, nitride, silicide or carbide. The thickness of such a shell may be <R/2, where R is the radius of the nanoparticle. This shell can improve colloid solution stability during deposition of the layer of nanoparticles.

The nanoparticles may be functionalized by polar, non-polar or amphiphilic groups to improves colloid solution stability during deposition of the layer of nanoparticles. Suitable groups may include carboxyl groups (—COOH), polyethylene glycol (PEG) groups. Such groups may be chemically linked to the nanoparticles and may help deposition of the layer of nanoparticles. Such groups may form a sparse sub-monolayer on the nanoparticles.

The nanoparticles may have a dimension in the range 10 nm-1 μm. In one embodiment, the nanoparticles may have a dimension of ~100 nm. The nanoparticles may be monodisperse (i.e. may all have a substantially uniform size) or may be polydisperse (i.e. may have a range of different sizes).

The nanoparticles may be arranged randomly or quasi-randomly.

The particle coverage of the support layer by the layer of nanoparticles may be in the range 50%-500% (i.e. from a sub-monolayer to several monolayers stacked).

The support layer may be formed from a material that has a relatively low absorption coefficient for EUV radiation. The support layer may be formed from a material which is suitable for use in the environment within an EUV lithographic apparatus, which may have a relatively high temperature, and may have a hydrogen plasma.

The nanoparticles may be formed from a plurality of different materials. For example a first set of the nanoparticles may be formed from one material (for example ruthenium) and a second set of the nanoparticles may be formed from another material (for example rhodium).

The support layer may be formed from a ceramic, the ceramic comprising one of the following metals: molybdenum, zirconium or yttrium in combination with at least one of the following: silicon, carbon, nitrogen or boron.

For example, the support layer may be formed from a ceramic comprising one of the following: MoSi, MoSiN, YSiB, SiC, ZrSi, ZrC or MoC.

It will be appreciated that as used here, these ceramics are not precise chemical formulae but merely indicate the elements in the ceramic (but not necessarily the ratios of those elements).

The support layer may be formed from graphene or diamond-like carbon.

The support layer may have a thickness of the order of 10 nm-1 μm. For example, in one embodiment the support layer may have a thickness of ~100 nm.

The support layer may comprise a cap layer to protect the support layer against EUV plasma etching. The cap layer may comprise a noble metal such as, for example, ruthenium or rhodium. The cap layer may have a thickness of less than 10 nm, for example less than 5 nm.

The support layer may comprise an intermediate layer disposed between the cap layer and a bulk of the support layer, wherein the intermediate layer is arranged to stabilize the cap layer against de-wetting.

The cap layer may comprise a noble metal such as, for example, ruthenium or rhodium. In use, the diffusor may be at high temperatures. The intermediate layer may comprise one of the following: metals: molybdenum, zirconium or yttrium. The intermediate layer may have a thickness of less than 5 nm, for example less than 2 nm.

The diffusor may further comprise a cover layer which at least partially covers the support layer and/or the layer of nanoparticles.

Such a cover layer can help to retain the nanoparticles on the support layer. Additionally or alternatively, the support layer can provide some degree of protection for the support layer and/or the layer of nanoparticles from the ambient environment. In use, the ambient environment may be the environment within an EUV lithographic apparatus, which may have a relatively high temperature, and may have a hydrogen plasma.

The cover layer may be formed from a material that is transmissive for EUV radiation. The cover layer may be formed, for example, from ruthenium (Ru) or silicon dioxide ($SiO_2$).

The diffusor may further comprise an interior layer disposed between the support layer and the layer of nanoparticles and wherein at least some of the nanoparticles are at least partially embedded in said interior layer.

Such an interior layer can help to adhere the nanoparticles on the support layer. Such an arrangement may be referred to as a micro-brazed diffusor.

The diffusor may be configured such that the angular scattering distribution in at least one scattering direction has a width of 5° or greater, for example, for EUV radiation.

The nanoparticles may be formed from a material having a refractive index n and wherein the magnitude of (1-n) is greater than a threshold value of 0.06.

In general, in order to maximise the angular dispersion of the EUV radiation it is desirable to maximize the optical contrast between the material from which the nanoparticles are formed and vacuum, i.e. it is desirable to maximize the absolute value of (1-n). In some embodiments, the magnitude of (1-n) is greater than a threshold value of 0.08. In some embodiments, the magnitude of (1-n) is greater than a threshold value of 0.1. In some embodiments, the magnitude of (1-n) is greater than a threshold value of 0.12.

The nanoparticles may be formed from a material having an extinction coefficient k for EUV radiation less than a threshold value of 0.04 $nm^{-1}$.

It will be appreciated that the diffusor according to the third aspect of the invention is a transmissive diffusor for use with EUV radiation. In general, in order to maximise the intensity of the EUV radiation which is output by the diffusor it is desirable to minimize the attenuation caused by the second material (which may be referred to as the scattering material). This can be done by minimizing the extinction coefficient of the scattering material (i.e. the layer of nanoparticles) and/or minimizing the thickness of the scattering material (i.e. the layer of nanoparticles). In some embodiments, the magnitude of the extinction coefficient k for EUV radiation is less than a threshold value of 0.03 $nm^{-1}$. In some embodiments, the magnitude of the extinction coefficient k for EUV radiation is less than a threshold value of 0.02 $nm^{-1}$. In some embodiments, the magnitude of the extinction coefficient k for EUV radiation is less than a threshold value of 0.01 $nm^{-1}$.

It will be understood that, for a given scattering material, in order to increase the amount of angular dispersion it is desirable to increase the thickness of the layer of nanoparticles whereas in order to reduce the attenuation caused by the scattering material it is desirable to decrease the thickness of the layer of nanoparticles. Having a scattering material for which the magnitude of (1-n) is large allows the thickness to be reduced (while still providing reasonable angular dispersion). Having a scattering material with a small extinction coefficient k for EUV radiation allows the thickness to be increased (while still providing reasonable transmission).

It will therefore be appreciated that, in practice, a suitable material may be selected balancing these two requirements.

In some embodiments, the magnitude of (1-n) is greater than a threshold value of 0.06 and the magnitude of the extinction coefficient k for EUV radiation is less than a threshold value of 0.01 $nm^{-1}$. In some embodiments, the magnitude of (1-n) is greater than a threshold value of 0.08 and the magnitude of the extinction coefficient k for EUV radiation is less than a threshold value of 0.02 $nm^{-1}$. In some embodiments, the magnitude of (1-n) is greater than a threshold value of 0.1 and the magnitude of the extinction coefficient k for EUV radiation is less than a threshold value of 0.03 $nm^{-1}$. In some embodiments, the magnitude of (1-n) is greater than a threshold value of 0.12 and the magnitude of the extinction coefficient k for EUV radiation is less than a threshold value of 0.04 nm$^{-1}$.

The material from which the nanoparticles are formed has a refractive index n and an extinction coefficient k for EUV radiation and wherein the ratio of the magnitude of (1-n) to the extinction coefficient k for EUV radiation is greater than a threshold value of 3.5.

A transmissivity of the diffusor according to the first, second or third aspects of the invention for EUV radiation may be greater than 50%.

According to a fourth aspect of the invention there is provided a measurement system for determining an aberration map or relative intensity map for a projection system comprising a diffusor according to the first, second or third aspects of the invention.

Such measurement systems typically comprise an object level patterning device (for example a diffraction grating or pinhole or the like); an illumination system; and an image level sensor apparatus. The illumination system is arranged to illuminate the patterning device with radiation. At least a portion of the radiation scattered by the patterning device is received by the projection system (whose properties are being measured) which is arranged to form an image of the patterning device on the image level sensor apparatus. It is desirable for such measurement systems that the entire entrance pupil of the projection system receives radiation from the patterning device. However, the illumination system is typically also used by a lithographic apparatus for forming a (diffraction limited) image of an object level reticle or mask on an image level substrate (e.g. a resist coated silicon wafer). This is the primary purpose of a lithographic apparatus and it is often desirable during such image formation exposures for the illumination mode to use a localized illumination mode. For example, it may be desirable to use a multipole (e.g. dipole or quadrupole) illumination mode, wherein in the pupil plane of the illumination system only a finite number (e.g. two or four) of discrete pole regions receive radiation.

When the lithographic apparatus is not exposing and the measurement system is measuring a pupil plane function (e.g. a relative phase or intensity map of the projection system) it may be possible to reconfigure the illumination system so as to fill the illumination system pupil plane (and therefore also fill the entrance pupil of the projection system). However, to do so (and to revert back to an exposure illumination mode before the next exposure) may take more time than is desired for such in-line measurements.

Therefore, the diffusor of the first, second or third aspect of the invention may be used, during such in-line measurements, to increase the angular spread of the radiation scattered from the object level patterning device so as to increase the proportion of the entrance pupil of the projection system which is filled with radiation.

The measurement system may comprise: a patterning device; an illumination system arranged to illuminate the patterning device with radiation; and a sensor apparatus; wherein the illumination system and patterning device may be configured such that the projection system receives at least a portion of the radiation scattered by the patterning device and the sensor apparatus may be configured such that the projection system projects the received radiation onto the sensor apparatus; and the diffusor may be operable to receive the radiation produced by the illumination system and to alter an angular distribution of the radiation before it illuminates the patterning device.

The diffusor may be moveable between at least: a first, operating position wherein the diffusor is at least partially disposed in a path of the radiation produced by the illumination system and is arranged to alter an angular distribution of the radiation before it illuminates the patterning device; and a second, stored position wherein the diffusor is disposed out of the path of the radiation produced by the illumination system.

According to a fifth aspect of the invention there is provided a lithographic apparatus comprising: the measurement system according to the fourth aspect of the invention; and a projection system configured to receive at least a portion of the radiation scattered by the patterning device and configured to project the received radiation onto the sensor apparatus.

The diffusor may be mounted on a patterning device masking blade of the lithographic apparatus, an edge of the patterning device masking blades defining a field region of the lithography apparatus.

According to a sixth aspect of the invention there is provided a method of forming a diffusor according to the second aspect of the invention, the method comprising: forming the first layer from the first material, the first layer comprising a nanostructure on at least one surface of the first layer; and forming the second layer from the second material on the at least one surface of the first layer.

Forming the first layer may comprise: providing a layer of support material; forming a self-assembled metal structure on a surface of the layer of support material; and selectively etching parts of the layer of support material that are not in contact with the self-assembled metal structure.

The support material may, for example, comprise silicon or porous silicon (pSi).

The self-assembled metal structure may be formed from, for example, gold. The self-assembled metal structure may be formed by physical vapour deposition (PVD). The self-assembly relies on the known and robust phenomenon that in first few nanometers of film deposition discrete metal islands are formed on the surface of the layer of the support material.

With this technique, high-aspect-ratio structures can be formed in the layer of support material having a lateral resolution (i.e. in the plane of the layer of the support material) of down to around 10 nm or less. Therefore, advantageously, a structure can be formed that can achieve an angular divergence for EUV radiation of order of 10°, for example or the order of 7°, whilst still having sufficient thickness of the second layer to achieve a phase shift of π radians for EUV radiation.

The layer of support material may be formed on a carrier layer, which may act to support the layer of support material while the diffusor is being formed and the method may further comprise removing said carrier layer once the first and second layers have been formed.

The carrier layer may be formed from silicon nitride (SiN), porous silicon (pSi) or molybdenum silicide (MoSi). The carrier layer may, for example, be removed by etching.

According to a seventh aspect of the invention there is provided a method of forming a diffusor as described herein, the method comprising: providing the support layer formed from the first material; and depositing a plurality of nanoparticles so as to form the layer of nanoparticles supported by the support layer.

The method according to the seventh aspect of the invention is advantageous since the process of depositing the nanoparticles so as to form the layer of nanoparticles supported by the support layer can result in a randomly or quasi-randomly arrangement of the nanoparticles. The method provides an alternative method of production of a diffusor that is cheap, simple and provides large freedom of substrate design for the support layer, so the support layer can be better tailored so as to allow thermal management of the diffusor.

For example, another method for forming a quasi-random diffracting structure may be to form a plurality of, for example rectangular, features on a support substrate having a quasi-random distribution of at least one of: height, pitch and/or width. Such structures require some mechanism to plan a quasi-random structure and then may be fabricated, for example, using lithographic techniques. In contrast, generally processes for depositing a plurality of nanoparticles so as to form a layer of nanoparticles will result in a random or quasi-random structure and are generally cheaper and simpler to execute. Furthermore, by varying properties of the layer of nanoparticles such as, for example, the materials, the sizes, the density of the nanoparticles within the layer the properties of the diffusor can be easily varied.

Depositing the plurality of nanoparticles so as to form the layer of nanoparticles supported by the support layer may be achieved using aerosol deposition and may comprise: providing an aerosol comprising the nanoparticles suspended in a carrier gas; and depositing the plurality of nanoparticles from the aerosol so as to form the layer of nanoparticles supported by the support layer.

Any suitable carrier gas may be used.

For embodiments wherein the aerosol is formed using spark ablation, the carrier gas may, for example, comprise an inert gas. Suitable inert gases may include, for example, noble gases (for example argon) or nitrogen. Such inert gases are beneficial since they can avoid unwanted reactions (for example oxidization) of the nanoparticles.

For embodiments wherein the aerosol is formed by forming a vapour from a colloid, the carrier gas may be a gas formed from a carrier liquid of the colloid. The carrier gas or carrier liquid may be selected to ensure that the colloid and/or the aerosol are stable. The carrier fluid may be selected to ensure that the carrier fluid can evaporate fully such that no molecular residuals from the carrier fluid are left after formation of the layer of nanoparticles. Generally, either a polar (for example water) carrier fluid or a non-polar (for example heptane or hexane) carrier fluid may be used.

This aerosol-based method has been successfully used to form a multi-layer layer of nanoparticles on a substrate for nanoparticle sizes up to around 20 nm.

Providing an aerosol comprising the nanoparticles suspended in a carrier gas may comprise formation of the aerosol using spark ablation.

Spark ablation is a known technique for aerosol generation. Electrodes formed from the material of the nanoparticles can be used, in combination with a voltage supply, to form nanoparticles of that material via spark ablation. A flow of suitable carrier gas past (or even through) the electrodes can be used to form the aerosol.

Providing an aerosol comprising the nanoparticles suspended in a carrier gas may comprise formation of a colloid comprising the nanoparticles suspended in a carrier liquid and forming a vapour from the colloid.

Depositing the plurality of nanoparticles from the aerosol so as to form the layer of nanoparticles supported by the support layer may be achieved via impaction and/or diffusion.

Impaction may be achieved by directing the aerosol at the support layer.

Depositing the plurality of nanoparticles so as to form the layer of nanoparticles supported by the support layer may be achieved using colloid deposition and may comprise: providing a colloid comprising the nanoparticles suspended in a carrier liquid; depositing the colloid on the support layer; and removing the carrier liquid via evaporation so as to deposit the plurality of nanoparticles from the colloid so as to form the layer of nanoparticles supported by the support layer.

For example, droplets of the colloid can be deposited onto the support layer (or an intermediate layer if used) and allowed to dry. As the carrier liquid evaporates, the nanoparticles remain on the support layer. The colloid droplets may have any suitable size (for example the droplets may have a volume of the order of 1 µL to 1 mL). The colloid may have any suitable concentration of nanoparticles (for example the droplets may have a concentration of the order of $\sim 10^{10}$-$10^{12}$ parts/µL).

A drying pattern from such a process can result in a sparse monolayer and/or a few monolayers. A random deposition pattern suitable for the diffusor can be achieved, for example, by using a poly-disperse colloid and/or a colloid comprising a mix of different shapes and/or materials. The colloid may be a poly-disperse colloid. This may result in a random deposition pattern suitable for the diffusor.

Such colloid-based wet synthesis methods have been successfully used to deposit silver, gold and platinum nanoparticles (for example having sizes of the order of 70 nm). Similar techniques can be used by the seventh aspect of the invention to deposit nanoparticles formed from, for example, ruthenium or rhodium.

Any suitable carrier liquid may be used. The carrier liquid may be selected to ensure that the colloid remains stable (i.e. such that the nanoparticles remain dispersed and do not dissolve and/or agglomerate). The carrier liquid may be selected to ensure that the carrier fluid can evaporate fully such that no molecular residuals from the carrier liquid are left after formation of the layer of nanoparticles. Generally, either a polar (for example water) carrier fluid or a non-polar (for example heptane or hexane) carrier fluid may be used. It will be apparent to the skilled person which carrier fluids may be appropriate for a given type of nanoparticles.

The may further comprise heating the support layer and/or the layer of nanoparticles so as to weld or sinter the layer of nanoparticles to the support layer.

This can further enhance the retention of the layer of nanoparticles on the support layer. Heating the support layer and/or the layer of nanoparticles may, for example, be achieved via e-beam exposure or heat annealing.

The diffusor may further comprise an interior layer disposed between the support layer and the layer of nanoparticles, the interior layer having a lower melting point than the support layer and the layer of nanoparticles, and the method may further comprise heating the interior layer above the melting point of the interior layer and allowing the interior layer to cool so as to braze the support layer to the layer of nanoparticles.

This can further enhance the retention of the layer of nanoparticles on the support layer. Heating the interior layer may, for example, be achieved via e-beam exposure or heat annealing.

The method may further comprise etching the support layer from a surface of the support layer that is opposite to a surface of the support layer supporting the layer of nanoparticles once the plurality of nanoparticles have been deposited so as to form the layer of nanoparticles supported by the support layer.

This back-etching of the support layer allows a thicker, more stable support layer to be used during the deposition of the nanoparticles. Advantageously, this can prevent damage, or even rupture, of the support layer. This final etching step may be particularly beneficial for embodiments wherein the nanoparticles are deposited using a colloid since it can to prevent capillary forces from braking the support layer. Once the layer of nanoparticles has been formed, the thickness of this layer can be finalized using the etching process.

The method may further comprise providing a cover layer which at least partially covers the support layer and/or the layer of nanoparticles.

BRIEF DESCRIPTION OF THE DRAWINGS

Embodiments of the invention will now be described, by way of example only, with reference to the accompanying schematic drawings, in which:

FIGS. 3A and 3B are schematic illustrations of a sensor apparatus;

FIG. 4A shows the intensity distribution for a dipole illumination mode of the lithographic apparatus shown in FIG. 1;

FIG. 4B shows the intensity distribution for a quadrupole illumination mode of the lithographic apparatus shown in FIG. 1;

DETAILED DESCRIPTION

Figure 1:
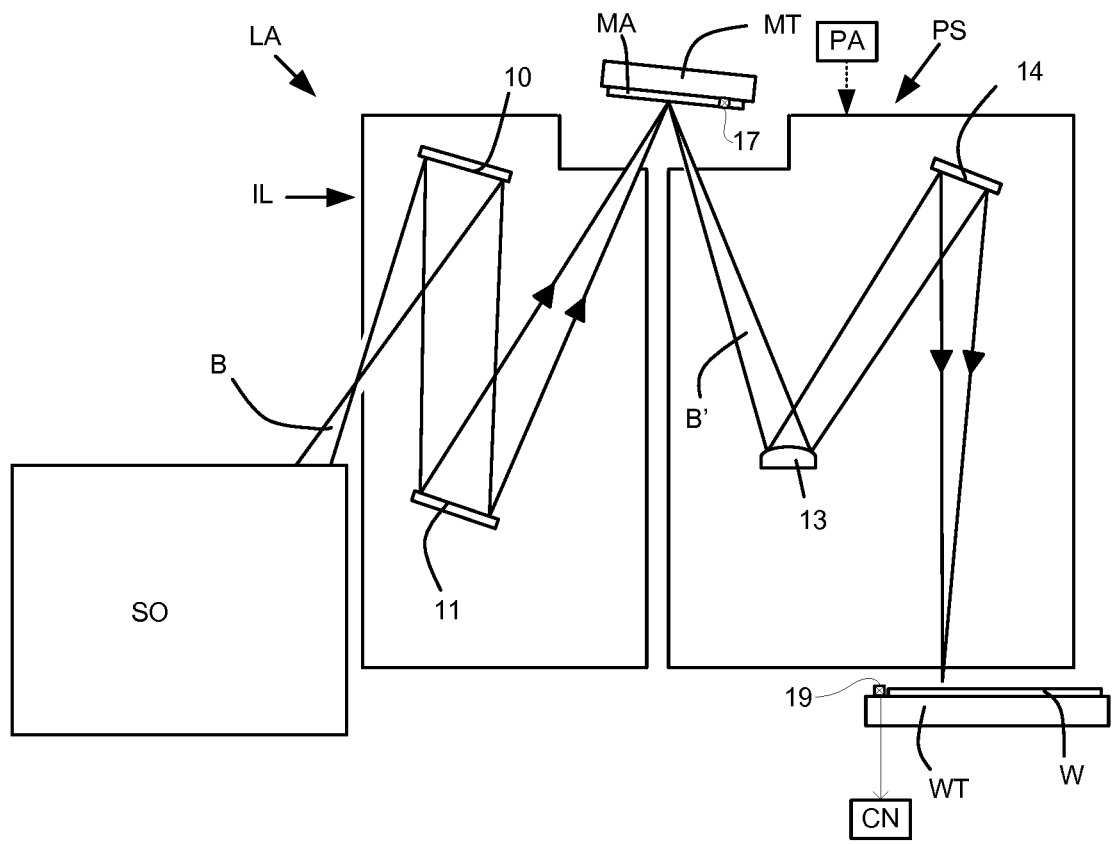
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

The lithographic apparatus may, for example, be used in a scan mode, wherein the support structure (e.g. mask table) MT and the substrate table WT are scanned synchronously while a pattern imparted to the radiation beam is projected onto a substrate W (i.e. a dynamic exposure). The velocity and direction of the substrate table WT relative to the support structure (e.g. mask table) MT may be determined by the demagnification and image reversal characteristics of the projection system PS. The patterned radiation beam that is incident upon the substrate W may comprise a band of radiation. The band of radiation may be referred to as an exposure slit. During a scanning exposure, the movement of the substrate table WT and the support structure MT may be such that the exposure slit travels over an exposure field of the substrate W.

As has been described above, a lithographic apparatus may be used to expose portions of a substrate W in order to form a pattern in the substrate W. In order to improve the accuracy with which a desired pattern is transferred to a substrate W one or more properties of the lithographic apparatus LA may be measured. Such properties may be measured on a regular basis, for example before and/or after exposure of each substrate W, or may be measured more infrequently, for example, as part of a calibration process. Examples of properties of the lithographic apparatus LA which may be measured include a relative alignment of components of the lithographic apparatus LA and/or an aberration of components of the lithographic apparatus. For example, measurements may be made in order to determine the relative alignment of the support structure MT for supporting a patterning device MA and the substrate table WT for supporting a substrate W. Determining the relative alignment of the support structure MT and the substrate table WT assists in projecting a patterned radiation beam onto a desired portion of a substrate W. This may be particularly important when projecting patterned radiation onto a substrate W which includes portions which have already been exposed to radiation, so as to improve alignment of the patterned radiation with the previously exposed regions.

Additionally or alternatively measurements may be made in order to determine optical aberrations of the projection system PS. An optical aberration is a departure of the performance of an optical system from paraxial optics and may result in blurring or distortion of the pattern which is exposed at the substrate W. Aberrations of the projection system PS may be adjusted for and/or accounted for so as to increase the accuracy with which a desired pattern is formed on a substrate W.

Measurements, such as the alignment and aberration measurements described above may be performed by illuminating a reflective marker 17 (as schematically shown in FIG. 1) with radiation. A marker is a reflective feature which when placed in the field of view of an optical system appears in an image produced by the optical system. Reflective markers described herein are suitable for use as a point of reference and/or for use as a measure of properties of the image formed by the optical system. For example, radiation reflected from a reflective marker may be used to determine an alignment of one or more components and/or optical aberrations of one or more components.

In the embodiment which is shown in FIG. 1, the reflective marker 17 forms part of a patterning device MA. One or more markers 17 may be provided on patterning devices MA used to perform lithographic exposures. A marker 17 may be positioned outside of a patterned region of the patterning device MA, which is illuminated with radiation during a lithographic exposure. In some embodiments, one or more markers 17 may additionally or alternatively be provided on the support structure MT. For example, a dedicated piece of hardware, often referred to as a fiducial, may be provided on the support structure MT. A fiducial may include one or more markers. For the purposes of this description a fiducial is considered to be an example of a patterning device. In some embodiments, a patterning device MA specifically designed for measuring one or more properties of the lithographic apparatus LA may be placed on the support structure MT in order to perform a measurement process. The patterning device MA may include one or more markers 17 for illumination as part of a measurement process.

In the embodiment which is shown in FIG. 1, the lithographic apparatus LA is an EUV lithographic apparatus and therefore uses a reflective patterning device MA. The marker 17 is thus a reflective marker 17. The configuration of a marker 17 may depend on the nature of the measurement which is to be made using the marker 17. A marker may, for example, comprise one or more reflective pin hole features comprising a reflective region surrounded by an absorbing region, a reflective line feature, an arrangement of a plurality of reflective line features and/or a reflective grating structure such as a reflective diffraction grating.

In order to measure one or more properties of the lithographic apparatus LA, a sensor apparatus 19 (as shown schematically in FIG. 1) is provided to measure radiation which is output from the projection system PS. The sensor apparatus 19 may, for example, be provided on the substrate table WT as shown in FIG. 1. In order to perform a measurement process, the support structure MT may be positioned such that the marker 17 on the patterning device MA is illuminated with radiation. The substrate table WT may be positioned such that radiation which is reflected from the marker is projected, by the projection system PS, onto the sensor apparatus 19. The sensor apparatus 19 is in communication with a controller CN which may determine one or more properties of the lithographic apparatus LA from the measurements made by the sensor apparatus 19. In some embodiments a plurality of markers 17 and/or sensor apparatuses 19 may be provided and properties of the lithographic apparatus LA may be measured at a plurality of different field points (i.e. locations in a field or object plane of the projection system PS).

As was described above, in some embodiments radiation reflected from a marker may be used to determine a relative alignment of components of the lithographic apparatus LA. In such embodiments, a marker 17 may comprise a feature which when illuminated with radiation imparts the radiation with an alignment feature. The feature may, for example, comprise one or more reflective patterns in the form of a grating structure.

The position of the alignment feature in the radiation beam B may be measured by a sensor apparatus 19 positioned at a substrate W level (e.g. on the substrate table WT as shown in FIG. 1). The sensor apparatus 19 may be operable to detect the position of an alignment feature in the radiation incident upon it. This may allow the alignment of the substrate table WT relative to the marker on the pattering device MA to be determined. With knowledge of the relative alignment of the patterning device MA and the substrate table WT, the patterning device MA and the substrate table WT may be moved relative to each other so as to form a pattern (using the patterned radiation beam B reflected from the patterning device MA) at a desired location on the substrate W. The position of the substrate W on the substrate table may be determined using a separate measurement process.

As was further described above, in some embodiments a patterning device MA may be provided with one or more markers 17 which may be used to measure aberrations of the projection system PS. Similarly to the alignment measurement described above, aberrations may be detected by measuring radiation reflected from a marker 17 with a sensor apparatus 19 located at or near to the substrate table WT. One or more markers 17 on a patterning device MA may be illuminated with EUV radiation, by the illumination system IL. Radiation reflected from the one or more markers is projected, by the projection system PS onto an image plane of the projection system PS. One or more sensor apparatuses 19 are positioned at or near to the image plane (e.g. on the substrate table WT as shown in FIG. 1) and may measure the projected radiation in order to determine aberrations of the projection system PS. An embodiment of a marker 17 and a sensor apparatus 19 which may be used to determine aberrations of the projection system PS will now be described with reference to FIGS. 2 and 3.

Figure 2:
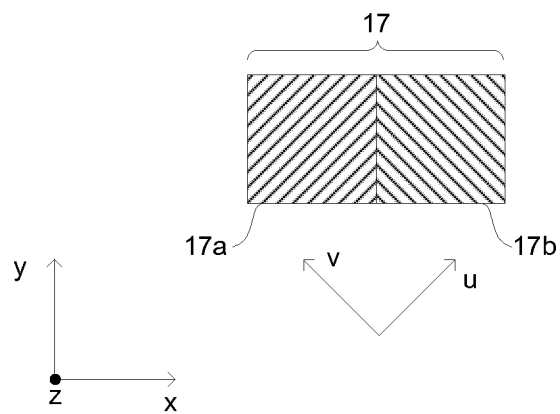
FIG. 2 is a schematic illustration of a reflective marker.

FIG. 2 is a schematic representation of a marker 17 which may form part of a patterning device MA according to an embodiment of the invention. Also shown in FIG. 2 is a Cartesian coordinate system. The y-direction may represent a scanning direction of the lithographic apparatus. That is, during a scanning exposure, the movement of the substrate table WT and the support structure MT may be such that a patterning device MA is scanned relative to a substrate W in the y-direction. The marker 17 lies generally in an x-y plane. That is the marker generally extends in a direction which is perpendicular to the z-direction. Although reference is made to the marker lying generally in a plane, it will be appreciated that the marker is not entirely constrained to a plane. That is, portions of the marker may extend out of a plane in which the marker generally lies. As will be explained further below, a marker may comprise a diffraction grating. A diffraction grating may comprise a three-dimensional structure including portions which do not lie entirely in a plane but instead extend out of the plane.

The marker 17 which is shown in FIG. 2 comprises a first portion 17a and a second portion 17b. Both the first and second portions comprise reflective diffraction gratings comprising a periodic grating structure. The grating structures extend in grating directions. The first portion 17a comprises a diffraction grating extending in a first grating direction which is denoted as the u-direction in FIG. 2. The second portion 17b comprises a diffraction grating extending in a second grating direction which is denoted as the v-direction in FIG. 2. In the embodiment of FIG. 2, the u and v-directions are both aligned at approximately 45° relative to both the x and y-directions and are substantially perpendicular to each other. The first and second portions 17a, 17b of the marker 17 may be illuminated with radiation at the same or different times.

Whilst the embodiment which is shown in FIG. 2 includes a first portion 17a and a second portion 17b comprising diffraction gratings orientated with perpendicular grating directions, in other embodiments a marker 17 may be provided in other forms. For example, a marker 17 may comprise reflective and absorbing regions arranged to form a checkerboard pattern. In some embodiments, a marker 17 may comprise an array of pinhole features. A reflective pinhole feature may comprise a region of reflective material surrounded by absorbing material.

When the first and/or second portions 17a, 17b of the marker are illuminated with radiation, a plurality of diffraction orders are reflected from the marker. At least a portion of the reflected diffraction orders enter the projection system PS. The projection system PS forms an image of the marker 17 on a sensor apparatus 19. FIGS. 3A and 3B are schematic illustrations of a sensor apparatus 19. FIG. 3A is a side-on view of the sensor apparatus and FIG. 3B is a top-down view of the sensor apparatus. Cartesian co-ordinates are also shown in FIGS. 3A and 3B.

The Cartesian co-ordinate system which is used in FIGS. 2, 3A and 3B is intended as a co-ordinate system of radiation propagating through the lithographic apparatus. At each reflective optical element, the z-direction is defined as the direction which is perpendicular to the optical element. That is, in FIG. 2, the z-direction is perpendicular to an x-y plane in which the patterning device MA and the marker 17 generally extend. In FIGS. 3A and 3B, the z-direction is perpendicular to an x-y plane in which the diffraction grating 19 and the radiation sensor 23 generally extend. The y-direction denotes a scanning direction, in which the support structure MT and/or the substrate table WT are scanned relative to each other during a scanning exposure. The x-direction denotes a non-scanning direction which is perpendicular to the scanning direction. It will be appreciated (for example, from FIG. 1) that, in a lithographic apparatus, the z-direction at the patterning device MA is not aligned with the z-direction at the substrate W. As explained above, the z-direction is defined at each optical element in the lithographic apparatus, as being perpendicular to the optical element.

The sensor apparatus 19 comprises a transmissive diffraction grating 21 and a radiation sensor 23. At least some of the radiation 25 which is output from the projection system PS passes through the diffraction grating 21 and is incident on the radiation sensor 23. The diffraction grating 21 is shown in more detail in FIG. 3B and comprises a checkerboard diffraction grating. Regions of the diffraction grating 21 shown in FIG. 3B which are shaded black represent regions of the diffraction grating 21 which are configured to be substantially opaque to incident radiation. Regions of the diffraction grating 21 shown in FIG. 3B which are not shaded represent regions which are configured to transmit radiation. For ease of illustration, the opaque and transmissive regions of the diffraction grating 21 are not shown to scale in FIG. 3B. For example, in practice the scale of the diffraction grating features, relative to the size of the diffraction grating itself may be smaller than is indicated in FIG. 3B.

The diffraction grating 21 which is shown in FIG. 3B is depicted as having a checkerboard configuration comprising square shaped transmissive and opaque regions. However, in practice it may be difficult or impossible to manufacture a transmissive diffraction grating comprising perfectly square shaped transmissive and opaque regions. The transmissive and/or opaque regions may therefore have cross-sectional shapes other than perfect squares. For example, the transmissive and/or opaque regions may have cross-sectional shapes comprising squares (or more generally rectangles) having rounded corners. In some embodiments, the transmissive and/or opaque regions may have cross-sectional shapes which are substantially circular or elliptical. In some embodiments, the diffraction grating 21 may comprise an array of pinholes formed in an opaque material.

The radiation sensor 23 is configured to detect the spatial intensity profile of radiation which is incident on the radiation detector 23. The radiation detector 23 may, for example, comprise an array of individual detector elements. For example, the radiation detector 23 may comprise a CCD or CMOS array. During a process for determining aberrations, the support structure MT may be positioned such that the marker 17 is illuminated with radiation from the illumination system IL. The substrate table WT may be positioned such that radiation reflected from the marker is projected by the projection system PS onto the sensor apparatus 19.

As was described above, a plurality of diffraction orders are formed at the marker 17. Further diffraction of radiation occurs at the diffraction grating 21. The interaction between diffraction orders formed at the marker 17 and diffraction patterns formed at the diffraction grating 21 results in an interference pattern being formed on the radiation detector 23. The interference pattern is related to the derivative of the phase of wavefronts which have propagated through the projection system. The interference pattern may therefore be used to determine aberrations of the projection system PS.

As was described above, the first and second portions of the marker 17 comprise diffraction gratings which are aligned perpendicular to each other. Radiation which is reflected from the first portion 17a of the marker 17 may provide information related to wavefronts in a first direction. Radiation which is reflected from the second portion 17b of the marker may provide information related to wavefronts in a second direction, which is perpendicular to the first direction. In some embodiments, the first and second portions of the marker may be illuminated at different times. For example, the first portion 17a of the marker 17 may be illuminated at a first time in order to derive information about wavefronts in the first direction and the second portion 17b of the marker 17 may be illuminated at a second time in order to derive information about wavefronts in the second direction.

In some embodiments, the patterning device MA and/or the sensor apparatus 19 may be sequentially scanned and/or stepped in two perpendicular directions. For example, the patterning device MA and/or the sensor apparatus 19 may be stepped relative to each other in the u and v-directions. The patterning device MA and/or the sensor apparatus 19 may be stepped in the u-direction whilst the second portion 17b of the marker 17 is illuminated and the patterning device MA and/or the sensor apparatus 19 may be stepped in the v-direction whilst the first portion 17a of the marker 17 is illuminated. That is, the patterning device MA and/or the sensor apparatus 19 may be stepped in a direction which is perpendicular to the grating direction of a diffraction grating which is being illuminated.

The patterning device MA and/or the sensor apparatus 19 may be stepped by distances which correspond with a fraction of the grating period of the diffraction gratings. Measurements which are made at different stepping positions may be analysed in order to derive information about a wavefront in the stepping direction. For example, the phase of the first harmonic of the measured signal may contain information about the derivative of a wavefront in the stepping direction. Stepping the patterning device MA and/or the sensor apparatus 19 in both the u and v-directions (which are perpendicular to each other) therefore allows information about a wavefront to be derived in two perpendicular directions, thereby allowing the full wavefront to be reconstructed.

In addition to stepping of the patterning device MA and/or the sensor apparatus 19 in a direction which is perpendicular to the grating direction of a diffraction grating which is being illuminated (as was described above), the patterning device MA and/or the sensor apparatus 19 may also be scanned relative to each other. Scanning of the patterning device MA and/or the sensor apparatus 19 may be performed in a direction which is parallel to the grating direction of a diffraction grating which is being illuminated. For example, the patterning device MA and/or the sensor apparatus 19 may be scanned in the u-direction whilst the first portion 17a of the marker 17 is illuminated and the patterning device MA and/or the sensor apparatus 19 may be scanned in the v-direction whilst the second portions 17a of the marker 17 is illuminated. Scanning of the patterning device MA and/or the sensor apparatus 19 in a direction which is parallel to the grating direction of a diffraction grating which is being illuminated allows measurements to be averaged out across the diffraction grating, thereby accounting for any variations in the diffraction grating in the scanning direction. Scanning of the patterning device MA and/or the sensor apparatus 19 may be performed at a different time to the stepping of the patterning device MA and/or the sensor apparatus 19 which was described above.

As was described above the diffraction grating 21 which forms part of the sensor apparatus 19 is configured in the form of a checkerboard. This may allow the sensor apparatus 19 to be used during a determination of wavefront phase variations in both the u-direction and the v-direction. The arrangements of diffraction gratings which form the marker 17 and the sensor apparatus 19 are presented merely as an example embodiment. It will be appreciated that a variety of different arrangements may be used in order to determine wavefront variations.

In some embodiments the marker 19 and/or the sensor apparatus 19 may comprise components other than a diffraction grating. For example, in some embodiments the marker 17 and/or the sensor apparatus 19 may comprise a single slit or one or more pin-hole feature through which at least a portion of a radiation beam may propagate. In the case of the marker 17, a pin-hole feature may comprise a portion of reflective material surrounded by absorbing material such that radiation is only reflected from a small portion of the marker. A single slit feature may have the form of a single strip of reflective material surrounded by absorbing material. A pin-hole feature and/or a single slit feature at the sensor apparatus 19, may be a transmissive feature. In general a marker 17 may be any feature which imparts a radiation beam with a feature, which may be used as a point of reference or to determine a measure of the radiation beam.

Whilst, in the embodiment described above a single marker 17 and sensor apparatus 19 is provided, in other embodiments a plurality of markers 17 and sensor apparatuses 19 may be provided in order to measure wavefront phase variations at different field points. In general any number and configuration of markers and sensor apparatuses 19 may be used to provide information about wavefront phase variations.

A controller CN (as shown in FIG. 1) receives measurements made at the sensor apparatus 19 and determines, from the measurements, aberrations of the projection system PS. The controller may be further configured to control one or more components of the lithographic apparatus LA. For example, the controller CN may control a positioning apparatus which is operable to move the substrate table WT and/or the support structure MT relative to each other. The controller CN may control an adjusting means PA for adjusting components of the projection system PS. For example, the adjusting means PA may adjust elements of the projection system PS so as to correct for aberrations which are determined by the controller CN.

The projection system PS comprises a plurality of reflective lens elements 13, 14 and an adjusting means PA for adjusting the lens elements 13, 14 so as to correct for aberrations. To achieve this, the adjusting means PA may be operable to manipulate reflective lens elements within the projection system PS in one or more different ways. The adjusting means PA may be operable to do any combination of the following: displace one or more lens elements; tilt one or more lens elements; and/or deform one or more lens elements.

The projection system PS has an optical transfer function which may be non-uniform, which can affect the pattern which is imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. It will be appreciated that the terms "transmission map" and "relative intensity map" are synonymous and that the transmission map may alternatively be referred to as a relative intensity map. A particularly convenient set of basis functions for expressing these scalar maps is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane).

Determining aberrations of the projection system PS may comprise fitting the wavefront measurements which are made by the sensor apparatus 19 to Zernike polynomials in order to obtain Zernike coefficients. Different Zernike coefficients may provide information about different forms of aberration which are caused by the projection system PS. Zernike coefficients may be determined independently at different positions in the x and/or the y-directions (i.e. at different field points).

Different Zernike coefficients may provide information about different forms of aberration which are caused by the projection system PS. Typically Zernike polynomials are considered to comprise a plurality of orders, each order having an associated Zernike coefficient. The orders and coefficients may be labelled with an index, which is commonly referred to as a Noll index. The Zernike coefficient having a Noll index of 1 may be referred to as the first Zernike coefficient, the Zernike coefficient having a Noll index of 2 may be referred to as the second Zernike coefficient and so on.

The first Zernike coefficient relates to a mean value (which may be referred to as a piston) of a measured wavefront. The first Zernike coefficient may not be relevant to the performance of the projection system PS and as such may not be determined using the methods described herein. The second Zernike coefficient relates to the tilt of a measured wavefront in the x-direction. The tilt of a wavefront in the x-direction is equivalent to a placement in the x-direction. The third Zernike coefficient relates to the tilt of a measured wavefront in the y-direction. The tilt of a wavefront in the y-direction is equivalent to a placement in the y-direction. The fourth Zernike coefficient relates to a defocus of a measured wavefront. The fourth Zernike coefficient is equivalent to a placement in the z-direction. Higher order Zernike coefficients relate to other forms of aberration (e.g. astigmatism, coma, spherical aberrations and other effects).

Throughout this description the term "aberrations" is intended to include all forms of deviation of a wavefront from a perfect spherical wavefront. That is, the term "aberrations" may relate to the placement of an image (e.g. the second, third and fourth Zernike coefficients) and/or to higher order aberrations such as those which relate to Zernike coefficients having a Noll index of 5 or more.

As was described in detail above, one or more reflective markers 17 may be used to determine the alignment and or aberration of components of the lithographic apparatus LA. In some embodiments, separate markers 17 may be used for determining the alignment of components to markers used to determine aberrations. For example, a patterning device MA suitable for use in a lithographic exposure process may be provided with one or more markers outside of a patterned region suitable for use in a lithographic exposure process. The one or more markers may be suitable for determining the alignment of the patterning device MA relative to the substrate table WT.

One or more markers 17 suitable for determining aberrations may be provided on a measurement patterning device which is separate from patterning devices MA (e.g. reticles) used to perform lithographic exposures. A measurement patterning device MA may, for example, be positioned on the support structure MT for the purposes of performing aberration measurements. The measurement patterning device MA may include other features suitable for determining other properties of the projection system PS. For example, a measurement patterning device may additionally include a marker suitable for determining the alignment of the measurement patterning device relative to the substrate table WT.

In some embodiments, the same marker may be used to determine both alignment and aberrations. For example, both alignment and aberrations may be determined using one or more markers in the form of a reflective grating structure (e.g. a diffraction grating). In some embodiments, both alignment and aberrations may be determined simultaneously using the same set of measurements.

References herein to a patterning device MA should be interpreted to include any device including one or more features configured to modify radiation. A patterning device MA may, for example, be provided with a pattern for use during a lithographic exposure (for example, the patterning device may be a reticle). Additionally or alternatively a patterning device may be provided with one or more markers for use in a measurement process. In general, patterning devices MA are removable components which are placed on the support structure MT in order to perform a specific process (e.g. to perform a lithographic exposure and/or perform one or more measurement processes). However, in some embodiments a lithographic apparatus LA itself may be provided with one or more patterning features. For example, the support structure MT may be provided with one or more patterning features (e.g. markers) for use in a measurement process. For example, the support structure MT may be provided with one or more fiducials which include one or more markers. In such embodiments, the support structure MT itself may be considered to be an example of a patterning device, since it is provided with one or more features configured to modify radiation. References herein to a patterning device comprising a reflective marker should not be interpreted to be limited to removable patterning devices but should be interpreted to include any device having a reflective marker disposed thereon.

Referring to FIG. 1, the pattering device MA may be considered to be disposed in an object plane of the projection system PS and the substrate W may be considered to be disposed in an image plane of the projection system PS. In the context of such a lithographic apparatus, the object plane of the projection system PL (where the patterning device MA is disposed), the image plane of the projection system PL (where the substrate W is disposed) and any planes conjugate thereto may be referred to as field planes of the lithographic apparatus. It will be appreciated that within an optical system (e.g. a lithographic apparatus) two planes are conjugate if each point within the first plane P is imaged onto a point in the second plane P'.

It will be appreciated that the lithographic apparatus LA comprises optics with optical power (i.e. focusing and/or diverging optics) in order to form an image in the image plane of an object in the object plane. Within such an optical system, between each pair of field planes it is possible to define a pupil plane which is a Fourier transform plane of a preceding field plane and a successive field plane. The distribution of the Electric field within each such pupil plane is related to a Fourier transform of an object disposed in a preceding field plane. It will be appreciated that the quality of such a pupil plane will depend on the optical design of the system and that such a pupil plane may even be curved. It is useful to consider two such pupil planes an illumination system pupil plane and a projection system pupil plane. The illumination system pupil plane and the projection system pupil plane (and any other pupil planes) are mutually conjugate planes. The intensity (or, equivalently, the electric field strength) distribution of radiation in the illumination system pupil plane $PP_{IL}$ may be referred to as the illumination mode or pupil fill and characterizes the angular distribution of the light cone at the patterning device MA (i.e. in the object plane). Similarly, the intensity (or, equivalently, the electric field strength) distribution of radiation in the projection system pupil plane $PP_{IL}$ characterizes the angular distribution of the light cone at the wafer level (i.e. in the image plane).

The illumination system IL may alter the intensity distribution of the beam in the illumination system pupil plane. This may be achieved by configuring the faceted field mirror device 10 and faceted pupil mirror device 11 appropriately.

During exposure of a substrate W the illumination system IL and the projection system PS are used to form a (diffraction limited) image of an object level patterning device MA on an image level substrate W (e.g. a resist coated silicon wafer). During such an exposure, it may be desirable for the illumination mode to use a localized illumination mode. For example, it may be desirable to use a multipole (e.g. dipole or quadrupole) illumination mode, wherein in the pupil plane of the illumination system $PP_{IL}$ only a finite number (e.g. two or four) of discrete pole regions receive radiation.

Two examples of such illumination modes are shown in FIGS. 4A and 4B. For example, the illumination mode may be a dipole distribution 30 as shown in FIG. 4A or a quadrupole distribution 32 as shown in FIG. 4B. Also shown in FIGS. 4A and 4B is a circle 34 which represents the limit of what can physically be captured by the projection system PS and imaged onto the image plane (this represents the numerical aperture NA, or the sine of the maximum angle that can be captured by the projection system PS). In coordinates that are normalised by the numerical aperture NA of the projection system PS, circle 34 has a radius $\sigma=1$. The dipole distribution 30 comprises two diametrically opposed pole regions 36 where the intensity is non-zero. The quadrupole distribution 32 comprises a first dipole distribution similar to that shown in FIG. 4A and a second dipole distribution rotated relative to the first by $\pi/2$ radians but otherwise identical to it. Therefore the quadrupole distribution 32 comprises four pole regions 34 where the intensity is non-zero.

When the lithographic apparatus is not exposing a substrate W, one of more reflective markers provided on a patterning device MA may be used in a measurement process, for example, to determine an alignment and/or aberrations associated with a lithographic apparatus LA. When using reflections from a marker to measure alignment and/or aberrations it may be desirable for the radiation reflected from the marker to fill a substantial portion of the pupil of the projection system PS. To achieve this, in principle, the illumination system IL may be reconfigured so as to fill the illumination system pupil plane (and therefore also fill the entrance pupil of the projection system). However, to do so (and to revert back to an exposure illumination mode before the next exposure) may take more time than is desired for such in-line measurements. Therefore, it is known to provide a diffusor during such measurements that is arranged to increase the angular spread of the radiation scattered from the object level patterning device so as to increase the proportion of the entrance pupil of the projection system PS which is filled with radiation.

Such a diffusor can be placed in a path of the radiation beam during these metrology measurements but not during exposure of a substrate W. This allows EUV lithographic apparatus to be operable to perform semi-continuous in-line metrology, which in turn can be used to maintain an optimum dynamic setup of the projection system PS, the support structure MT and the substrate table WT. In addition, such measurement systems may be used to align patterning devices MA to substrates W before exposure of the substrate W.

Some existing measurement systems use, at object level, a combined diffusor and patterning device (for example a one-dimensional diffraction grating). One arrangement uses a three-dimensional structure mounted on the support structure MT, comprising a recessed diffuser and a grating membrane that are disposed in two different planes. The EUV radiation beam B radiation beam exits the illumination system IL, reflects from the recessed diffusor (which increases the angular spread of the radiation) and then, after reflection, passes through the grating membrane (which scatters the radiation, some of the scattered radiation being captured by the projection system). Such a three-dimensional arrangement cannot be formed on a reticle and therefore is formed on a fiducial.

Another arrangement, as described in WO2017/207512, uses a reflective object that is a combined diffusor and patterning device. This arrangement is of the form of a multilayer reflective stack, arranged to preferentially reflect EUV radiation, to which is applied a pattern (for example a diffraction grating) of EUV absorbing material. The layers multilayer reflective stack are provided with a surface roughness such that the reflected radiation is diffuse. However, although such a patterning device can, in principle, be provided on a reticle, it is significantly more complex to manufacture a patterning device with such a built in surface roughness. Therefore, in practice, such a patterning device is more likely to be formed on a fiducial.

Embodiments of the present invention relate to novel diffusors that are particularly suitable for use with EUV measurement systems within EUV lithographic apparatus of the type discussed above.

Figure 5A:
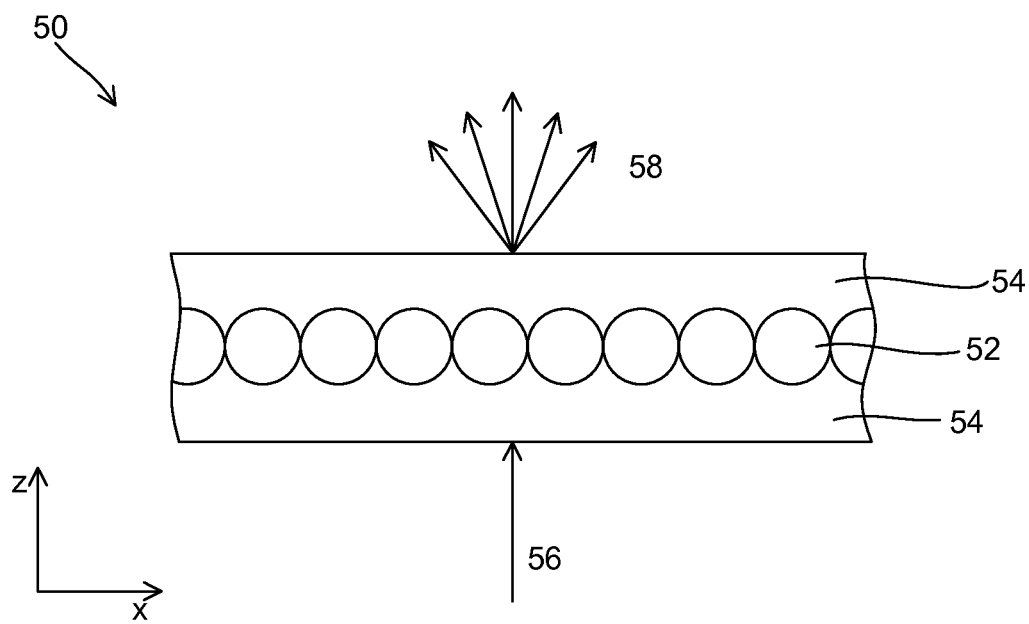
FIG. 5A is a schematic cross sectional view of a diffusor according to a first embodiment of the present invention and which may form part of the lithographic system shown in FIG. 1.
Figure 5B:
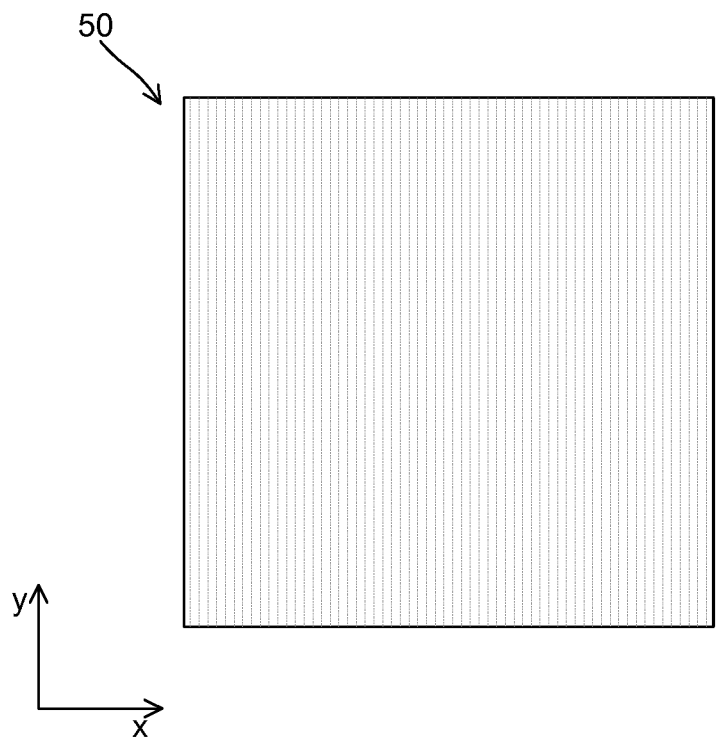
FIG. 5B is a schematic plan view of the diffusor shown in FIG. 5A.

A diffusor 50 of according to a first embodiment of the present invention is shown schematically in FIGS. 5A and 5B. The diffusor 50 comprises a membrane formed from carbon nanotubes 52 and two layers of a scattering material 54 applied to two opposed surfaces of the carbon nanotube membrane 52. The carbon nanotube membrane 52 may be considered to form a layer of support material, which has nanostructure provided on the two opposed surfaces thereof.

The carbon nanotube membrane 52 has a refractive index close to 1 for EUV radiation and a relatively low absorption coefficient for EUV radiation. Therefore, the carbon nanotube membrane 52 may be considered to be relatively optically neutral for EUV radiation.

In contrast, the layers of scattering material 54 are formed from a material having suitable optical properties so as to cause a large angular dispersion for EUV radiation (whilst also having a reasonably large transmissivity for EUV radiation).

Accordingly, the layers of scattering material 54 are formed from a refractive index that is different to a refractive index of the carbon nanotube membrane 52. In particular, the scattering material may be formed from a material with refractive index n such that the magnitude of (1-n) is as large as possible. Additionally, the scattering material may be formed from a material having an extinction coefficient k for EUV radiation that is as small as possible.

It will be appreciated that the diffusor 50 is a transmissive diffusor for use with EUV radiation. In general, in order to maximise the intensity of the EUV radiation which is output by the diffusor 50 it is desirable to minimize the attenuation caused by the layers of scattering material 54. This can be done by minimizing the extinction coefficient of the scattering material and/or minimizing the thickness of the scattering material. Furthermore, it will be understood that, for a given scattering material, in order to increase the amount of angular dispersion it is desirable to increase the thickness of the layer(s) whereas in order to reduce the attenuation caused by the scattering material it is desirable to decrease the thickness of the layer(s). Having a scattering material with for which the magnitude of (1-n) is large allows the thickness to be reduced (while still providing reasonable angular dispersion). Having a scattering material with a small extinction coefficient k for EUV radiation allows the thickness to be increased (while still providing reasonable transmission).

Figure 6:
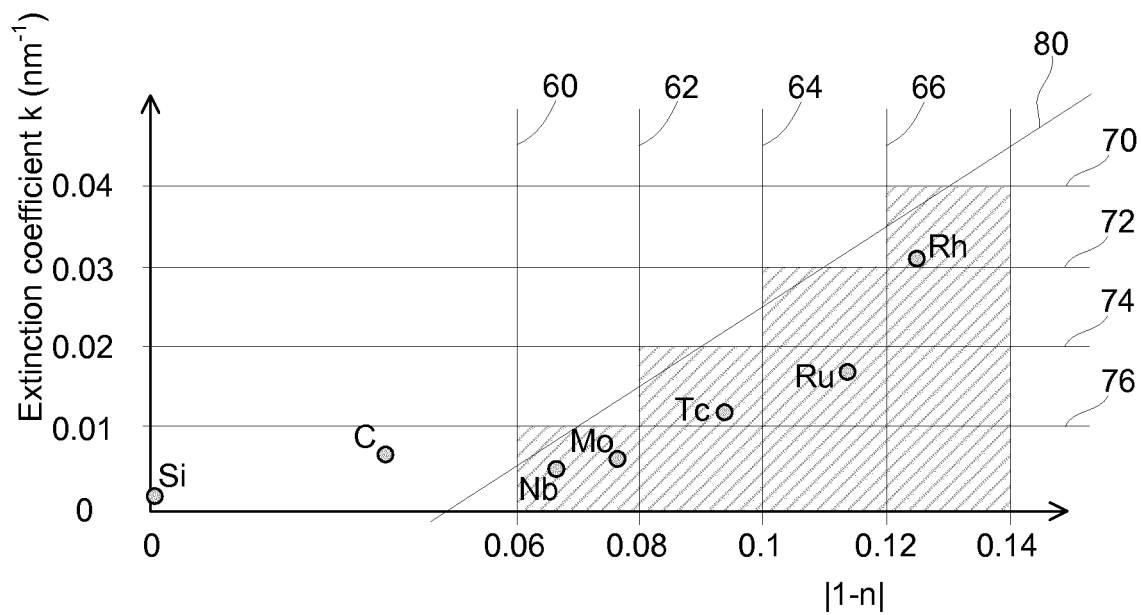
FIG. 6 shows a plot of an extinction coefficient k for EUV radiation against the magnitude of (1-n) for EUV radiation for some materials.

Suitable materials for the layers of scattering material 54 include: molybdenum, ruthenium or niobium. FIG. 6 shows a plot of extinction coefficient k for EUV radiation against the magnitude of (1-n) for EUV radiation for these three materials and for carbon and silicon.

As already stated, it is desirable to maximise the magnitude of (1-n) of the scattering material for EUV radiation. In some embodiments, the magnitude of (1-n) of the scattering material for EUV radiation may be greater than a threshold value of 0.06 (i.e. to the right of line 60 in FIG. 6). In some embodiments, the magnitude of (1-n) of the scattering material for EUV radiation may be greater than a threshold value of 0.08 (i.e. to the right of line 62 in FIG. 6). In some embodiments, the magnitude of (1-n) of the scattering material for EUV radiation may be greater than a threshold value of 0.1 (i.e. to the right of line 64 in FIG. 6). In some embodiments, the magnitude of (1-n) of the scattering material for EUV radiation may be greater than a threshold value of 0.12 (i.e. to the right of line 66 in FIG. 6).

As already stated, it is desirable to minimise extinction coefficient k of the scattering material for EUV radiation. In some embodiments, the scattering material may have an extinction coefficient k for EUV radiation of less than a threshold value of 0.04 nm$^{-1}$ (i.e. below the line 70 in FIG. 6). In some embodiments, the scattering material may have an extinction coefficient k for EUV radiation of less than a threshold value of 0.03 nm$^{-1}$ (i.e. below the line 72 in FIG. 6). In some embodiments, the scattering material may have an extinction coefficient k for EUV radiation of less than a threshold value of 0.02 nm$^{-1}$ (i.e. below the line 74 in FIG. 6). In some embodiments, the scattering material may have an extinction coefficient k for EUV radiation of less than a threshold value of 0.01 nm$^{-1}$ (i.e. below the line 76 in FIG. 6).

It will be understood that, for a given scattering material, in order to increase the amount of angular dispersion it is desirable to increase the thickness of the layer(s) whereas in order to reduce the attenuation caused by the scattering material it is desirable to decrease the thickness of the layer(s). Having a scattering material for which the magnitude of (1-n) is large allows the thickness to be reduced (while still providing reasonable angular dispersion). Having a scattering material with a small extinction coefficient k for EUV radiation allows the thickness to be increased (while still providing reasonable transmission). It will therefore be appreciated that, in practice, a suitable material may be selected balancing these two requirements.

In some embodiments, the magnitude of (1-n) is greater than a threshold value of 0.06 and the magnitude of the extinction coefficient k for EUV radiation is less than a threshold value of 0.01 nm$^{-1}$; or the magnitude of (1-n) is greater than a threshold value of 0.08 and the magnitude of the extinction coefficient k for EUV radiation is less than a threshold value of 0.02 nm$^{-1}$; or the magnitude of (1-n) is greater than a threshold value of 0.1 and the magnitude of the extinction coefficient k for EUV radiation is less than a threshold value of 0.03 nm$^{-1}$; or the magnitude of (1-n) is greater than a threshold value of 0.12 and the magnitude of the extinction coefficient k for EUV radiation is less than a threshold value of 0.04 nm$^{-1}$. That is, the material may be found in the cross hatched region of FIG. 6.

In some embodiments, the magnitude of (1-n) and the extinction coefficient k for EUV radiation satisfy the following relationship:

$$\frac{|1-n|}{(k+0.025)} > 2 \quad (1)$$

where |1-n| is the magnitude of (1-n). This is equivalent to being below the line 80 in FIG. 6.

By forming the diffusor 50 from multiple layers, the carbon nanotube membrane 52 (which may be referred to as a support layer) may be used to impart a nanostructure to the layers 54 of scattering material (which may be referred to as a scattering layer).

Providing layers 54 of material that cause scattering and have a nanostructure formed thereon is particularly advantageous for use with EUV radiation (which may, for example, have a wavelength of 13.5 nm) because such a nanostructure comprises features with a dimension that is comparable to, or smaller than, the wavelength of the radiation that it is desired to diffuse. Under these conditions, the scattering is in the Mie-scattering regime, and significant angular dispersion can be achieved. For example, in some embodiments, the nanostructures formed in both the carbon nanotube membrane 52 and the layers of scattering material 54 comprise features with a dimension in the range 2-10 nm.

The carbon nanotube membrane 52 can be created in a variety of ways, either as a randomly oriented collection of nanotubes, or as a structured array of nanotubes. Especially the structured array type works well as a diffraction/scattering device: the nanotubes have typical diameters of 2-10 nm, forming a grating structure with dimensions well below the EUV wavelength of 13.5 nm. In the diffusor 50 shown in FIGS. 5A and 5B, the diffusor 50 is generally planar, lies generally in the x-y plane and the membrane 52 comprises a structured array of nanotubes which extend generally in the x direction. It will be appreciated that, as used herein, an object being described as being generally planar means that the dimensions of the object are significantly smaller in one dimension (the z direction in FIGS. 5A and 5B) than in the other two dimensions.

As shown rather schematically in FIG. 5A, in use, radiation 56 is incident on the diffusor 50 propagating generally in the z direction. This incident radiation 56 may correspond to the radiation beam B output by the illumination system IL. It will be appreciated that the incident radiation may comprise radiation having a range of different angles of incidence and the arrow 56 shown in FIG. 5A may represent the direction of a chief ray. The layers of scattering material 54 cause this incident radiation to be spread over a greater range of angles. This is indicated schematically by arrows 58.

In use, diffusor 50 may be used to increase the range of angles with which radiation reflected from an object level marker enters the projection system PS. In particular, it may be desirable for each part of the diffusor 50 to cause a divergence of the radiation 58 which is of the order of angular range of radiation accepted by a patterning device MA in the lithographic apparatus LA. For example, in one embodiment, the numerical aperture of the patterning device MA (and the projection system PS) in the lithographic apparatus may be of the order of 0.08, which corresponds to an angular range of approximately 7°. Therefore, it may be desirable for each lens formed by the second portion 105 to cause a divergence of the radiation 56 which is of the order of 7°. This may ensure that each field point on the patterning device MA receives radiation from substantially the whole range of angles within a cone with a full angular extent of the order of 7°. Equivalently, this may ensure that the patterning device is illuminated with a substantially full pupil fill.

Figure 7:
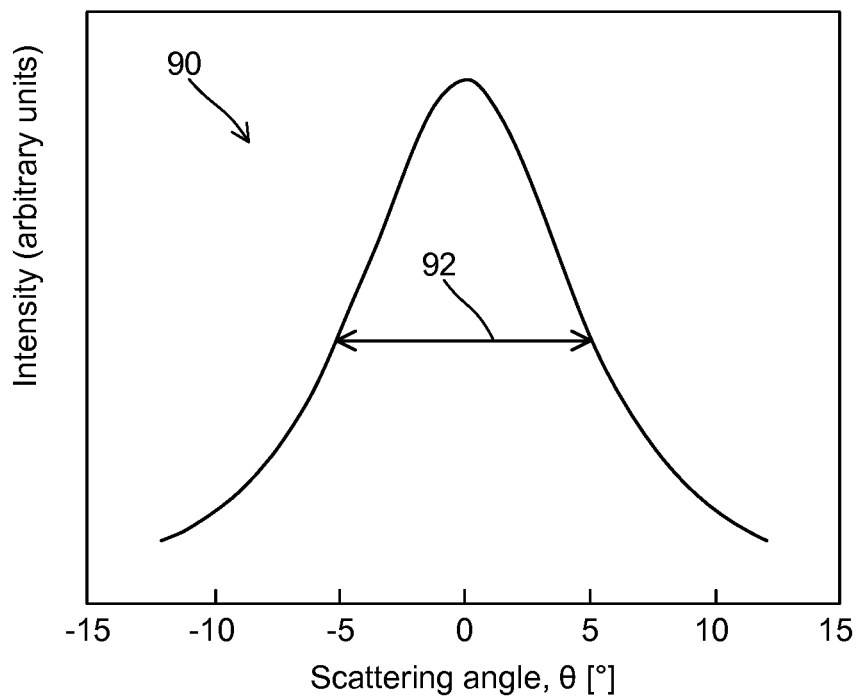
FIG. 7 shows the intensity distribution of scattered radiation as a function of the scattering angle in a scattering direction for a diffusor of the type shown in FIGS. 5A and 5B.

FIG. 7 shows the intensity distribution 90 of the scattered radiation 58 as a function of the scattering angle in a scattering direction of the diffusor 50 for an embodiment wherein the carbon nanotubes in the carbon nanotube membrane 52 have a diameter of around 10 nm and the layers 54 of scattering material comprise a 4 nm thickness of molybdenum. The carbon nanotube density of the carbon nanotube membrane 52 for this embodiment is around 50%. It can be seen from FIG. 7 that it is possible for the width 92 of this angular distribution 90 (for example the full width at half maximum) to be of the order of 7°.

In some embodiments, the diffusor 50 may have a thickness (in the z-direction in FIGS. 5A and 5B) arranged to cause a phase shift of $(2m+1)\pi$ radians for EUV radiation 56 propagating across the thickness of the diffusor 50. Advantageously, this suppresses zero-order (or specular) scattering.

Since the carbon nanotube membrane 52 is relatively optically neutral for EUV radiation, the phase shift caused by propagating through the diffusor 50 may be predominantly caused by the layers of scattering material 54. It will be appreciated that the phase shift caused by propagating through the scattering material is $2\pi/\lambda$ multiplied by the change in optical path length that results from the scattering material, where $\lambda$ is the wavelength of the EUV radiation. If the scattering material is immersed in an optical medium having a refractive index of $n_2$ then the change in optical path length that results from the scattering material is given by $(n-n_2) \cdot t$, where t is the thickness of the scattering material.

For example, for an embodiment wherein the scattering material comprises molybdenum (with a refractive index of approximately 0.92) in vacuum (i.e. $n_2=1$), a phase shift of $\pi$ radians may be achieved for EUV radiation with a wavelength of 13.5 nm if the thickness of the material is approximately 85 nm. If the molybdenum is formed on the carbon nanotube membrane 52 as a plurality of layers each having a thickness of around 8 nm, a phase shift of approximately $\pi$ radians may be achieved having 10 layers. The transmission of such a structure for EUV radiation is >50%.

It will be appreciated that the diffusor 50 shown in FIGS. 5A and 5B forms a diffraction grating wherein the grating lines extend generally in the y-direction. Therefore, the diffusor 50 shown in FIGS. 5A and 5B predominantly causes angular dispersion of EUV radiation 56 passing through it in the x-direction (which may be referred to as the scattering direction of the diffusor 50 in a plane of the diffusor 50).

According to some embodiments of the present invention there are provided diffusors that comprise at least two diffusors 50 of the type shown in FIGS. 5A and 5B, the scattering directions of the at least two diffusors 50 being different.

For example, in one embodiment, the diffusor may comprise two diffusors 50 of the type shown in FIGS. 5A and 5B: a first diffusor 50 arranged to cause angular dispersion in the x-direction; and a second diffusor 50 arranged to cause angular dispersion in the y-direction.

By adding more diffusors 50 of the type shown in FIGS. 5A and 5B, each having a different scattering direction, scattering in all directions can be achieved. For example, additional diffusors 50 may be added with their scatting directions arranged at +45° and −45° to the x direction may be added. Additionally, additional diffusors 50 may be added with their scatting directions arranged at +30°, +60°, −30° and −60° to the x direction may be added and so on.

In this way, some embodiments of the present invention relate to diffusors that comprise a plurality of layers (each layer comprising, for example, a diffusor 50 of the type shown in FIGS. 5A and 5B), each layer arranged to change an angular distribution of EUV radiation passing through it differently. Advantageously, by providing a plurality of layers, each layer being arranged to change an angular distribution of EUV radiation passing through it differently, the diffusor provides an arrangement whereby an EUV radiation beam can be more efficiently diffused over a desired range of angles. In addition, the plurality of layers which change the angular distribution of the EUV radiation passing through it differently provides more control over the angular distribution of the radiation exiting the diffusor.

In some embodiments, the scattering properties of the individual layers (each being a diffusor 50 of the type shown in FIGS. 5A and 5B) can be individually tuned. This can be achieved, for example, by varying parameters of the carbon nanotube membranes 52 such as, for example, the carbon nanotube diameters and/or the carbon nanotube packing density. In this way, such multi-layer diffusors can be tailored to the entrance pupil of a projection system PS within the lithographic apparatus. For example, the scattering properties may be tuned so as to fill the entrance pupil of the projection system PS; to minimise gradients across the entrance pupil; and/or to minimize the amount of radiation that is scattered outside of the numerical aperture of the projection system PS.

For example, at least two of the plurality of layers of such a multi-layer diffusor can be arranged to cause different amounts of angular dispersion of EUV radiation passing through them in their respective scattering directions. Advantageously, this can allow the amount of dispersion to be tailored for a particular purpose. For example, the projection system PS of a lithographic apparatus LA may apply a reduction factor so as to form an image with features that are smaller than corresponding features on object level reticle or mask. In some systems, the projection system PS may have an anamorphic design whereby different reduction factors are applied in two orthogonal directions. With such a design, the numerical aperture may be represented by an ellipse in the entrance pupil of the projection system PS (as opposed to a circle). With such an anamorphic projection system PS it may be desirable to provide a diffusor with, for example, more diffusion in a direction that corresponds to a major axis of this ellipse and less diffusion in a direction that corresponds to a minor axis of this ellipse. This can be achieved by using two layers (each being a diffusor 50 of the type shown in FIGS. 5A and 5B) which each causes different amounts of angular dispersion of EUV radiation in their respective (mutually perpendicular) scattering directions.

Although in the above described embodiments, a support layer for the layers 54 of scattering material is provided by a carbon nanotube membrane, in alternative embodiments the support layer may comprise any material that is provided with a nanostructure. In some embodiments, the support layer may be formed from a material that is relatively optically neutral for EUV radiation (i.e. having a refractive index close to 1 for EUV radiation and a relatively low absorption coefficient for EUV radiation). In one embodiment, the support layer is alternatively provided by porous silicon.

A diffusor of according to a second embodiment of the present invention, and a process for forming the same, is now discussed with reference to FIGS. 8A to 11.

The diffusor according to the second embodiment of the invention comprises a layer of support material comprising a nanostructure on at least one surface, the nanostructure having been formed by a self-assembled metal-assisted chemical etching of the support material. This layer of support material is coated with a scattering material. The formation of the nanostructure in the support material by a self-assembled metal-assisted chemical etching of the support material is now discussed with reference to FIGS. 8A to 9.

Figure 8A:
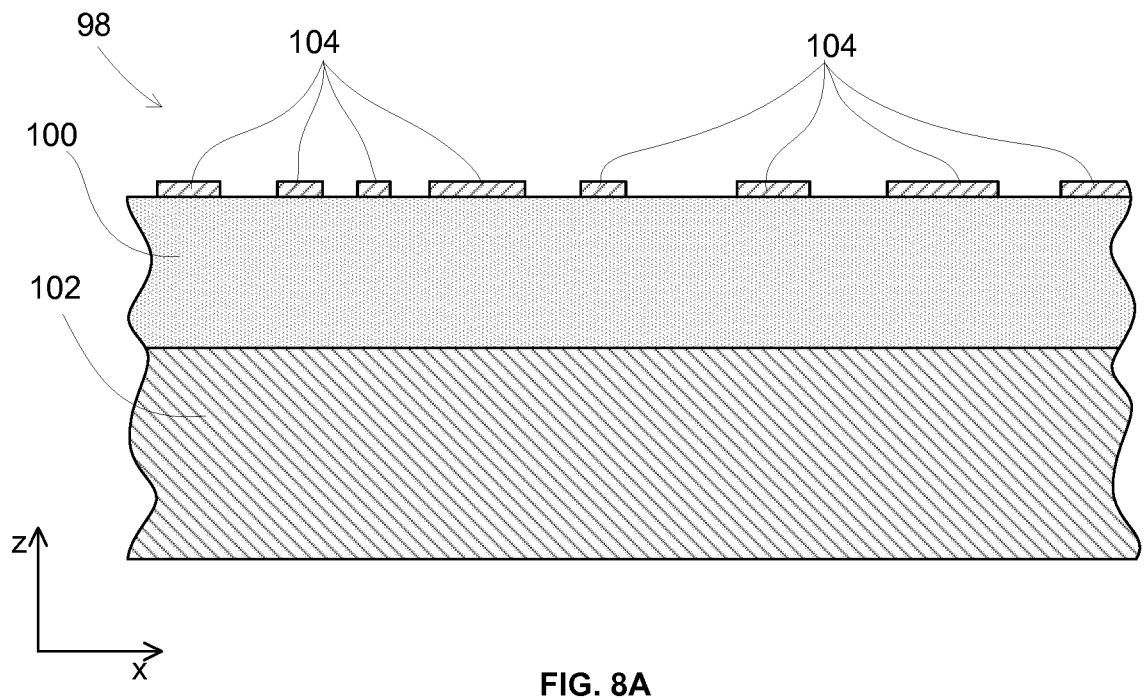
FIG. 8A is a schematic cross sectional view of a portion of an intermediate layer stack from which a diffusor according to a second embodiment of the present invention is formed.
Figure 8B:
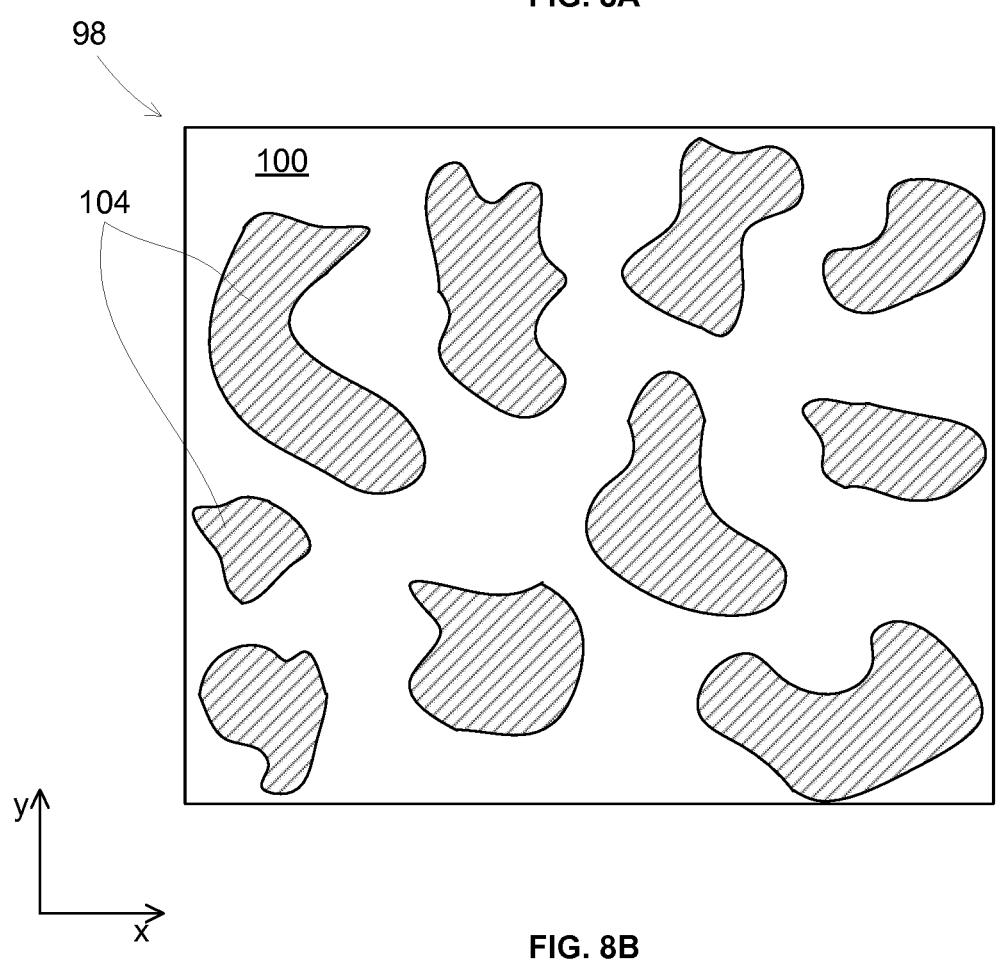
FIG. 8B is a schematic plan view of a portion of the intermediate layer stack shown in FIG. 8A.

First, an intermediate layer stack 98 is formed. FIG. 8A is a schematic cross sectional view of a portion of the intermediate layer stack 98 and FIG. 8B is a schematic plan view of a portion of the intermediate layer stack 98.

The intermediate layer stack 98 comprises a layer of support material 100. The support material may, for example, comprise silicon or porous silicon (pSi). The layer of support material 100 may have a thickness of the order of 60 nm. In some embodiments, the support material is a material having a refractive index close to 1 for EUV radiation and a relatively low absorption coefficient for EUV radiation. For such embodiments, the support material may be considered to be relatively optically neutral for EUV radiation.

The layer of support material 100 is formed on a carrier layer 102, which may act to support the layer of support material 100 while the diffusor is being formed. The carrier layer 102 may be formed from silicon nitride (SiN), porous silicon (pSi) or molybdenum silicide (MoSi). The carrier layer 102 may, for example, have a thickness of the order of 100 nm.

The intermediate layer stack 98 further comprises a self-assembled metal structure, which is formed on a surface of the layer of support material 100. The self-assembled metal structure may be formed from, for example, gold. The self-assembled metal structure may be formed by physical vapour deposition (PVD). The self-assembly relies on the known and robust phenomenon that in first few nanometers of film deposition discrete metal islands 104 are formed on the surface of the layer of the support material 100 (see in particular FIG. 8B). This is explained, for example, in X. Yu et al., "Coalescence and percolation in thin metal-films", Phys. Rev. B 44(23), 13163-13166 (1991), which is incorporated herein in its entirety by reference.

Figure 9:
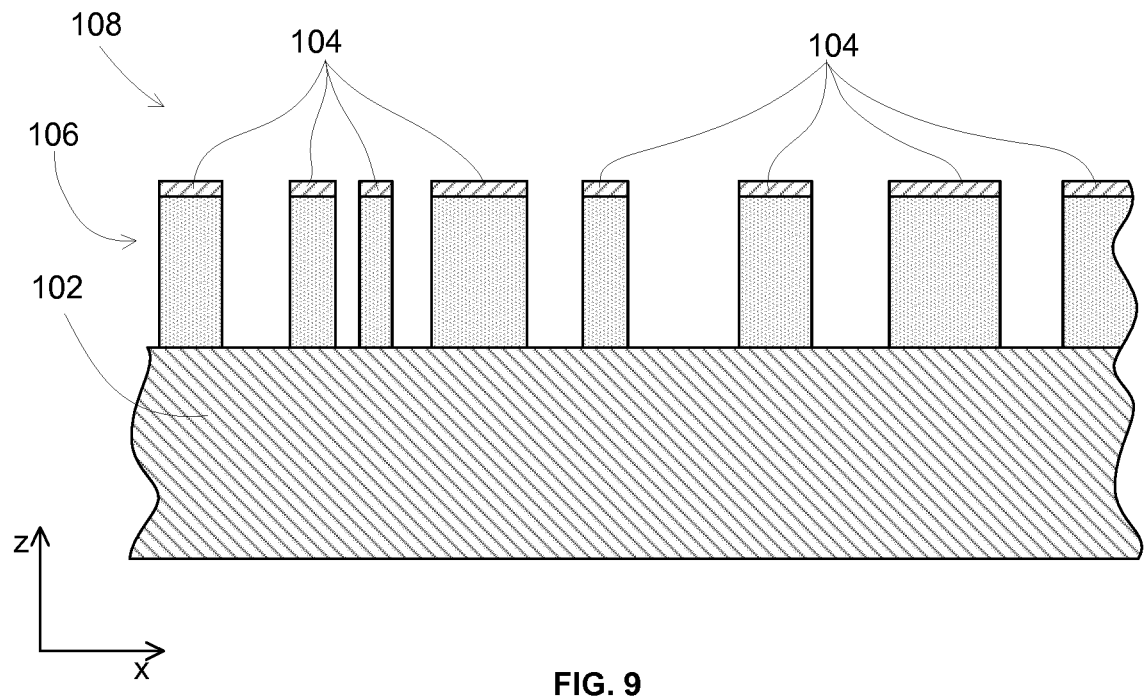
FIG. 9 is a schematic cross sectional view of a portion of a second intermediate layer stack formed from the intermediate layer stack shown in FIGS. 8A and 8B by selectively etching a layer of support material in the intermediate layer stack.

A second intermediate layer stack 108 is then formed from the intermediate layer stack 98, as now described with reference to FIG. 9. The layer of support material 100 in the intermediate layer stack 98 is then selectively etched so as to form a modified layer of support material 106, as shown in cross-section in FIG. 9. In effect, the discrete metal islands 104 mask those parts of the layer of support material 100 that they are in contact with from the etchant. This type of anisotropic catalytic etching of crystalline silicon in direct contact with such metal islands is also a known and robust process, which has been quite thoroughly investigated for several metals and etchants. This is described, for example, in J. Duran et al., "Fabrication of ultrahigh aspect ratio silicon nanostructures using self-assembled gold metal-assisted chemical etching", J. Micro/Nanolith. MEMS MOEMS 16(1), 014502 (2017), which is incorporated herein in its entirety by reference.

With this technique, high-aspect-ratio structures can be formed in the modified layer of support material 106 having a lateral resolution (i.e. in the plane of the layer of the support material 106, i.e. the x-y plane) of down to around 10 nm or less. The modified layer of support material 106 may therefore be considered to be a layer comprising a nanostructure on at least one surface thereof.

It will be appreciated that the layer of support material 100 in the intermediate layer stack 98 is selectively etched down to the interface between the layer of support material 100 and the carrier layer 102. In an alternative embodiment, an etch-stop layer may be provided between the layer of support material 100 and the carrier layer 102. For example, such an etch-stop layer may comprise a 2 nm layer of ruthenium. This may promote emissive cooling of the diffusor. Furthermore, by using an etch-stop layer may allow for a greater range of etchants to be used and may provide better control over the etching process.

Figure 10:
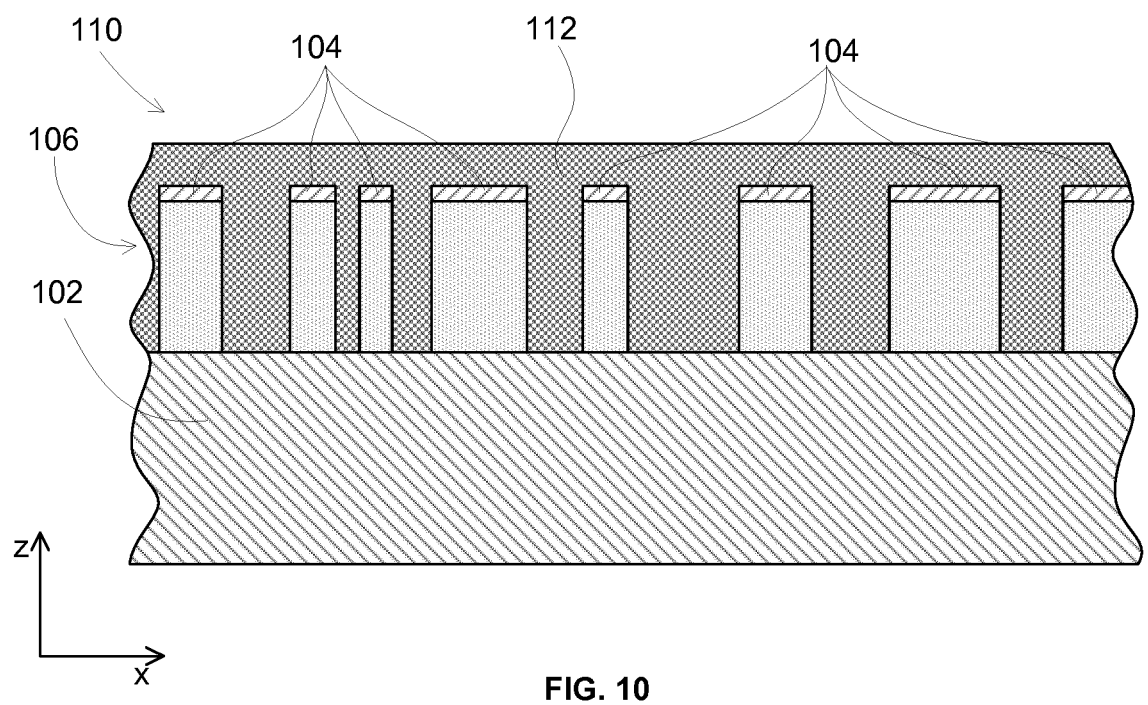
FIG. 10 is a schematic cross sectional view of a portion of a third intermediate layer stack formed from the second intermediate layer stack shown in FIG. 9 by forming a layer of scattering material on a modified layer of support material within the second intermediate layer stack.

A third intermediate layer stack 110 is then formed from the second intermediate layer stack 108, as now described with reference to FIG. 10. As shown in cross-section in FIG. 10, a layer of scattering material 112 is formed on the modified layer of support material 106. The layer of scattering material 112 may be considered to be adjacent to a surface of the modified layer of support material 106. As such, the layer of scattering material 112 also comprises a nanostructure. The layer of scattering material 112 may comprise a 5 nm coating of ruthenium.

In this embodiment, the discrete metal islands 104 are encapsulated between the layer of scattering material 112 and the modified layer of support material 106. This may aid in the radiative cooling of the diffusor. However, in an alternative embodiment, the discrete metal islands 104 may be removed after the etching and before the layer of scattering material 112 is formed on the modified layer of support material 106.

Figure 11:
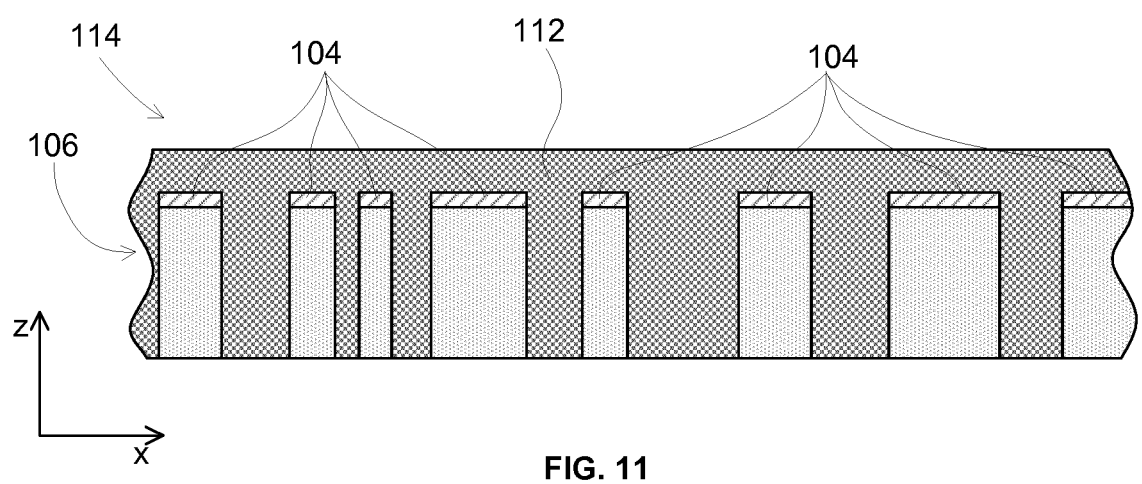
FIG. 11 is a schematic cross sectional view of a portion of the diffusor according to a second embodiment of the present invention formed from the third intermediate layer stack shown in FIG. 10.

Finally, the carrier layer 102 is back-etched to form the diffusor 114 (see FIG. 11).

With this technique, high-aspect-ratio structures can be formed in the modified layer of support material 106 and, in turn, in the layer of scattering material 112 having a lateral resolution (i.e. in the plane of the diffusor 114, i.e. the x-y plane) of down to around 10 nm or less. Such lateral resolution is well beyond what can be achieved by other means such as, for example, lithographic or e-beam patterning. As discussed above, providing such a layer of scattering material 112 that causes scattering and has a nanostructure formed thereon is particularly advantageous for use with EUV radiation (which may, for example, have a wavelength of 13.5 nm) because such a nanostructure comprises features with a dimension that is comparable to, or smaller than, the wavelength of the radiation that it is desired to diffuse. Under these conditions, the scattering is in the Mie-scattering regime, and significant angular dispersion can be achieved.

This order of lateral resolution of the structure formed in the layer of scattering material 112 allows the diffusor 114 to achieve scattering angles of >10°. Furthermore, the high aspect ratio allows a sufficient thickness of the layer of scattering material 112 to ensure sufficient phase effect for the diffuser 114. For example, as explained above, it may be desirable for the diffusor 114 to have a thickness (in the z-direction in FIG. 11) arranged to cause a phase shift of $(2m+1)\pi$ radians for EUV radiation propagating across the thickness of the diffusor 114. Advantageously, this suppresses zero-order (or specular) scattering.

If the scattering material is immersed in an optical medium having a refractive index of $n_2$ then the change in optical path length that results from the scattering material is given by $(n-n_2) \cdot t$, where t is the thickness of the scattering material. For example, for an embodiment wherein the scattering material comprises molybdenum (with a refractive index of approximately 0.92) in vacuum (i.e. $n_2=1$), a phase shift of $\pi$ radians may be achieved for EUV radiation with a wavelength of 13.5 nm if the thickness of the material is approximately 85 nm.

It will be appreciated that the layer of support material 100 can be formed from any suitable material that is relatively optically neutral for EUV radiation and which can be etched to form the modified layer of support material 106. Suitable materials comprise silicon and porous silicon (pSi).

It will be appreciated that the layer of scattering material 112 is formed from a material having suitable optical properties so as to cause a large angular dispersion for EUV radiation (whilst also having a reasonably large transmissivity for EUV radiation). It will be appreciated that the layer of scattering material 112 may have any of the properties of the layers of scattering material 54 in the diffusor 50 shown in FIGS. 5A and 5B. Furthermore, the same considerations, as discussed above, that may be taken into account in the selection of a suitable material for the layers of scattering material 54 in the diffusor 50 shown in FIGS. 5A and 5B may also be taken into account when selecting of a suitable material for the layer of scattering material 112.

Accordingly, the layer of scattering material 112 may be formed from a material having a refractive index that is different to a refractive index of the layer of support material 100 (which may, for example, comprise silicon). In particular, the scattering material may be formed from a material with refractive index n such that the magnitude of (1-n) is as large as possible. Additionally, the scattering material may be formed from a material having an extinction coefficient k for EUV radiation that is as small as possible.

Suitable materials for the layer of scattering material 112 include: molybdenum, ruthenium or niobium. FIG. 6 shows a plot of extinction coefficient k for EUV radiation against the magnitude of (1-n) for EUV radiation for these three materials and for carbon and silicon.

It will be appreciated that the diffusor 114 shown in FIG. 11 forms a two-dimensional nanostructure. Therefore, the diffusor 14 shown in FIG. 11 causes angular dispersion of EUV radiation passing through it both directions in the plane of the diffusor (i.e. in the x-direction and the y-direction).

A diffusor of according to a third embodiment of the present invention, and a process for forming the same, is now discussed with reference to FIGS. 12 to 14.

Figure 12A:
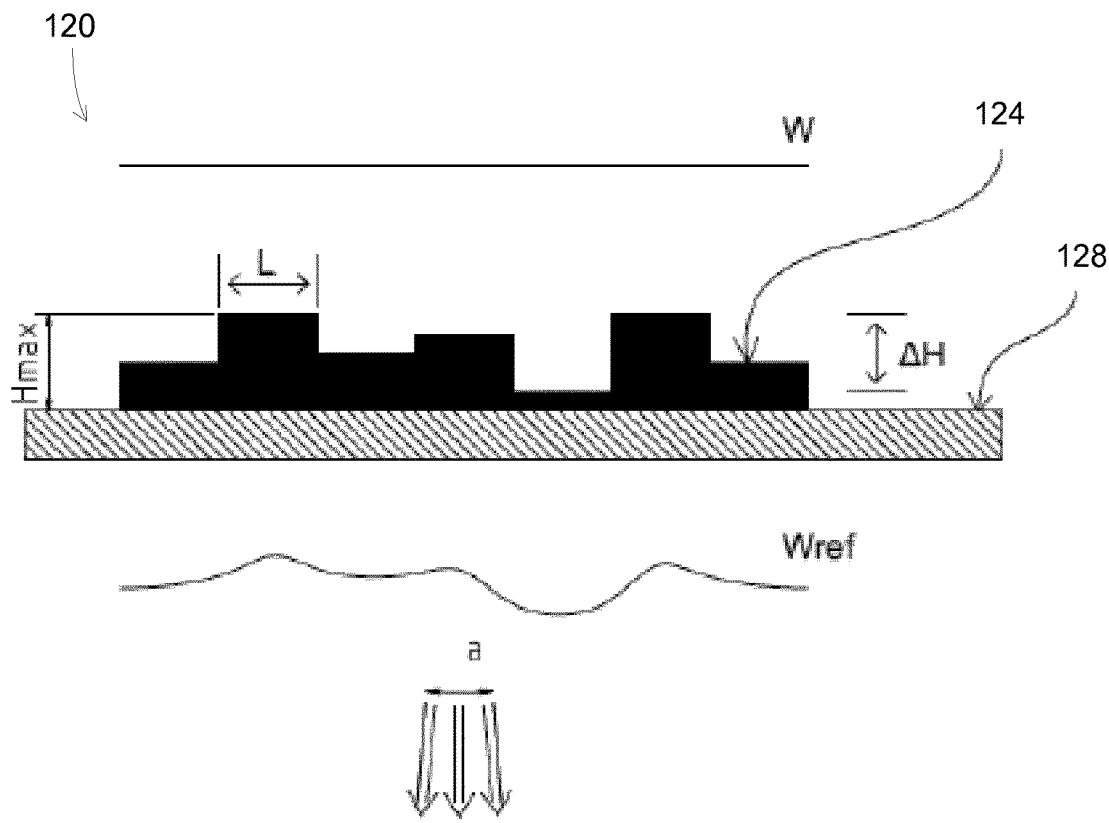
FIG. 12A is a schematic representation of a diffusor based on quasi-random refractive structures disposed on a support layer, the refractive structure comprising a plurality of, for example rectangular, features having a uniform pitch of L and a quasi-random distribution of height H.
Figure 12B:
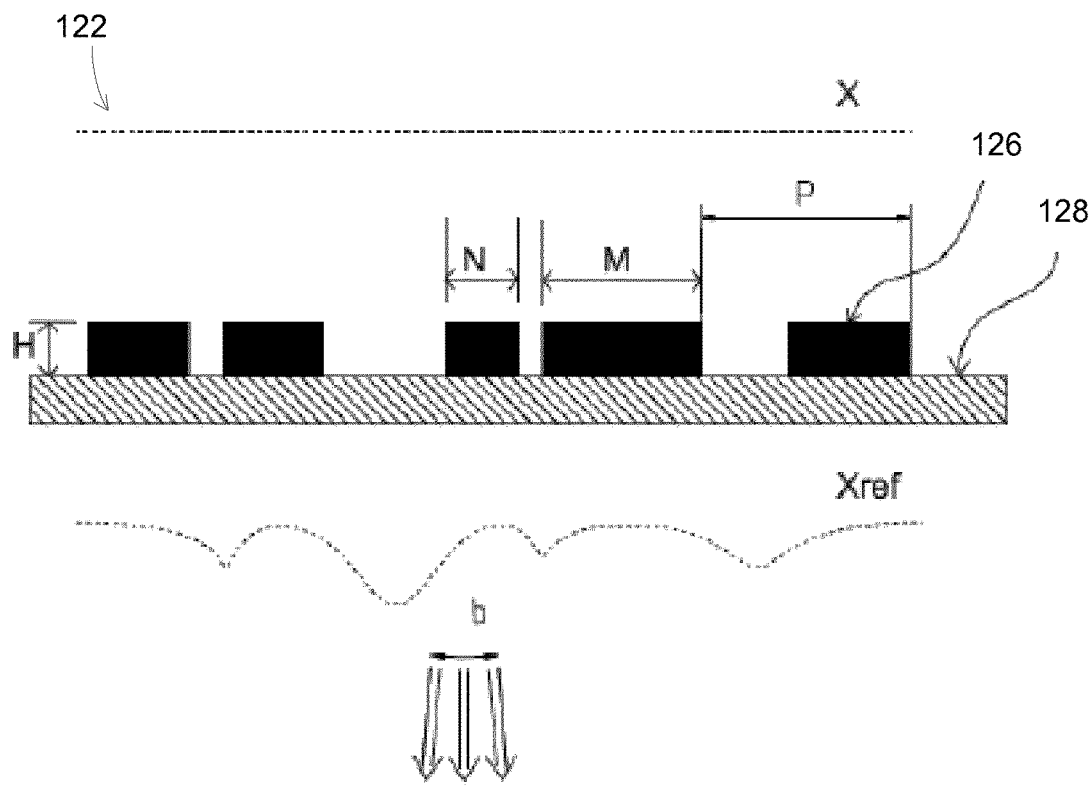
FIG. 12B is a schematic representation of a diffusor based on quasi-random refractive structures disposed on a support layer, the refractive structure comprising a plurality of, for example rectangular, features having a uniform height H, and a quasi-random distribution of pitches P or widths of N, M.

FIGS. 12A and 12B are schematic representations of two diffusors 120, 122 based on quasi-random refractive structures 124, 126 disposed on a support layer 128. In each of FIGS. 12A and 12B a flat wavefront W, X is shown incident on the diffusors 120, 122. In addition, a distorted wavefront Wref, Xref that results from the incident flat wavefront W, X after refracting through the refractive structures 124, 126 is also shown. As shown schematically in FIGS. 12A and 12B, each of the diffusors 120, 122 results in some scattering a, b. The scattering a, b can be estimated, based on the phase delay distribution, over the typical pitch of the structure.

FIG. 12A shows a refractive structure 124 comprising a plurality of, for example rectangular, features having a uniform pitch of L and a quasi-random distribution of height H. The scattering a (in radians) can be estimated as:

$$a \cong \Delta H \cdot \frac{n-1}{L} \qquad (2)$$

where $\Delta H$ is a measure of the spread of heights and n is the refractive index of the medium from which the refractive structure 124 is formed.

FIG. 12B shows a refractive structure 126 comprising a plurality of, for example rectangular, features having a uniform height H, a pitch of P and a width of N, M. With such a general structure (as shown in FIG. 12B), in the case that the pitch P is variable and the width M, N is uniform, the scattering b (in radians) can be estimated as:

$$b \cong \frac{\Delta P}{P_{av}^2} \cdot (n-1) \cdot H \qquad (3)$$

where ΔP is a measure of the spread of pitches, $P_{av}$ is the average pitch, n is the refractive index of the medium from which the refractive structure 126 is formed, and H is the uniform height. Alternatively, with such a general structure (as shown in FIG. 12B), in the case that the pitch P is uniform and the refractor width M is variable, the scattering b (in radians) can be estimated as:

$$b \cong \frac{\Delta M}{P^2} \cdot (n-1) \cdot H \qquad (4)$$

where ΔM is a measure of the spread of widths, P is the uniform pitch, n is the refractive index of the medium from which the refractive structure 126 is formed, and H is the uniform height.

It is desirable to keep the total thicknesses of the refractive structures 124, 126 relatively small so as to avoid too much absorption of EUV radiation. For example the thickness of structures is kept moderate, so that:

$$k \cdot \frac{H}{\lambda} < 2 \qquad (5)$$

where k is the extinction coefficient of the material, H is a typical height scale, λ is the wavelength of the EUV radiation (for example 13.5 nm). In addition, in order to allow for a good mixing, for a fixed scattering c (in radians), it is desirable to select a typical length scale such that:

$$\lambda < L < \frac{\lambda}{c} \qquad (6)$$

where L is a length scale, λ is wavelength of the EUV radiation (for example 13.5 nm) and c is the amount of scattering in radians (which may for example be given by a as given by equation (2) or b as given by equations (3) or (4)).

It may be desirable to achieve a scattering angle of the order of 5° (or 0.1 radians). The maximum amount of scattering will be achieved using materials with the largest value of n−1, such as, for example, are ruthenium and rhodium (for which n~0.9).

With such materials (ruthenium or rhodium), a scattering angle of the order of 5° may be achieved using a refractive structure 124 of the type shown in FIG. 12A with, for example, L~50 nm and ΔH≅50 nm (which is consistent with the inequalities (5) and (6)).

With such materials (ruthenium or rhodium), a scattering angle of the order of 5° may be achieved using a refractive structure 126 of the type shown in FIG. 12B of equal height H placed randomly with a reasonable filling factor (for example with a ratio of the average width $M_{av}$ to the average pitch $P_{av}$ of the order of $$\frac{M_{av}}{P_{av}} \sim 0.5)$$

if the ratio of the height H to the average pitch $P_{av}$ is of the order of 2 (i.e.

$$\frac{H}{P_{av}} \cong 0.5).$$

This can be achieved, for example, with a pitch of the order of P~50 nm and a height of the order H~100 nm (which is consistent with the inequalities (5) and (6)).

The inventors have realised an approximation of the random refractive structures 124, 126 as shown in FIGS. 12A and 12B and discussed above can be achieved with a layer of randomly placed nanoparticles (for example, made of ruthenium or rhodium), provided the typical sizes of the nanoparticles is comparable to a typical displacement of adjacent nanoparticles in the layer. For example, if a ratio of an average dimension D of the nanoparticles to an average displacement $Q_{av}$ of adjacent nanoparticles is in the range 1 to 2.

Figure 13A:
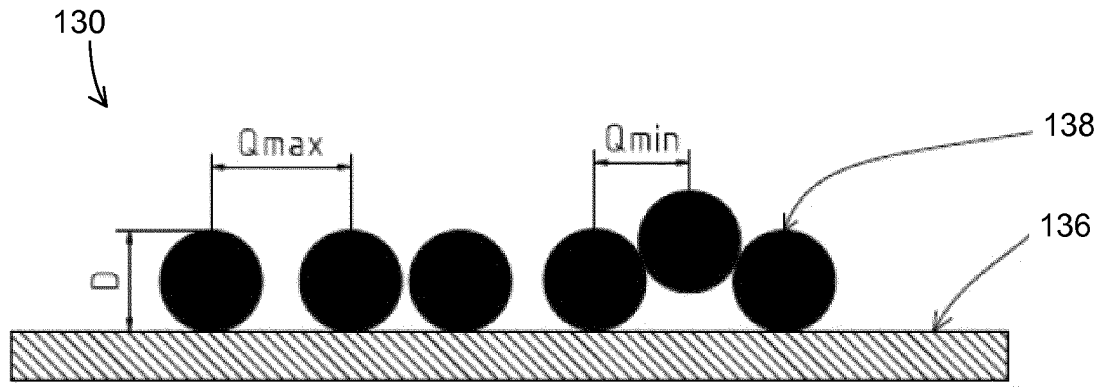
FIG. 13A is a schematic representation of a diffusor according to an embodiment of the invention comprising a monodisperse layer of nanoparticles supported by a support layer.
Figure 13B:
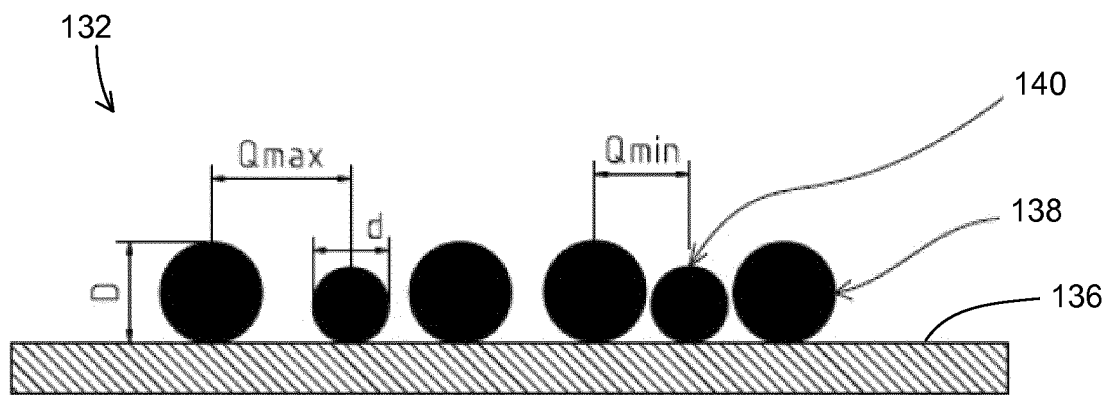
FIG. 13B is a schematic representation of a diffusor according to an embodiment of the invention comprising a polydisperse layer of nanoparticles supported by a support layer.
Figure 13C:
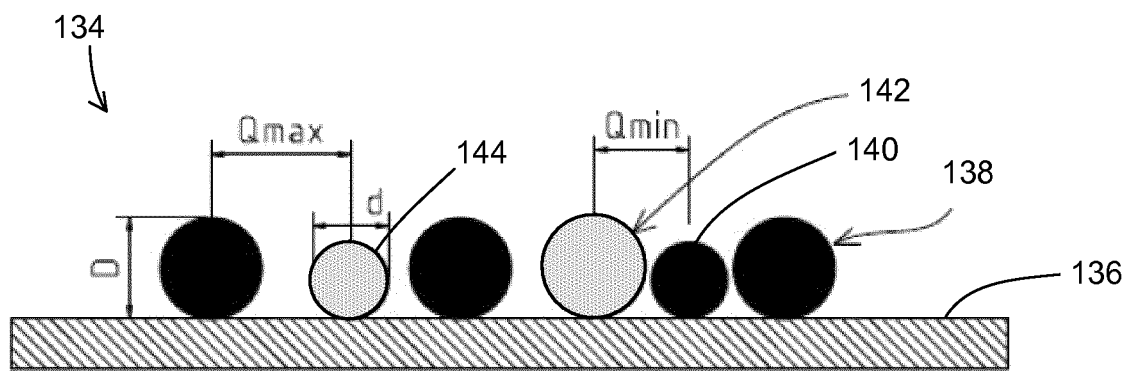
FIG. 13C is a schematic representation of a diffusor according to an embodiment of the invention comprising a polydispers layer of nanoparticles comprising two different types of materials.

Diffusors 130, 132, 134 according to a third embodiment of the invention are shown schematically in FIGS. 13A to 13C.

The diffusors 130, 132, 134 are configured to receive and transmit EUV radiation. Each diffusor 130, 132, 134 comprises a support layer 136 formed from a first material and a layer of nanoparticles supported by the support layer 136. The nanoparticles are formed from a material that is transmissive for EUV radiation and which causes refraction of EUV radiation incident on the diffusor 130, 132, 134.

In the embodiment shown in FIG. 13A, the layer of nanoparticles is monodisperse, comprising a plurality of nanoparticles 138 that all have a substantially uniform size. In particular, the nanoparticles 138 have a diameter D and have a random distribution of displacements of adjacent nanoparticles, the displacements of adjacent nanoparticles ranging from a minimum displacement $Q_{min}$ to a maximum displacement $Q_{max}$.

In the embodiment shown in FIG. 13B, the layer of nanoparticles is polydisperse, comprising a plurality of nanoparticles 138 that all have a range of different sizes. In particular, a first set of nanoparticles 138 have a diameter D and a second set of nanoparticles 140 have a diameter d (which is smaller than D). The nanoparticles 138, 140 have a random distribution of displacements of adjacent nanoparticles, the displacements of adjacent nanoparticles ranging from a minimum displacement $Q_{min}$ to a maximum displacement $Q_{max}$.

In the embodiment shown in FIG. 13C, the layer of nanoparticles. The nanoparticles are formed from a plurality of different materials. In particular, a first set of the nanoparticles 138, 140 (represented by black circles) is formed from one material (for example ruthenium) and a second set of the nanoparticles 142, 144 (represented by grey circles) is formed from another material (for example rhodium). Both the first set of nanoparticles 138, 140 and the second set of nanoparticles 142, 144 is polydisperse, comprising a plurality of nanoparticles 138 that all have a range of different sizes. In particular, some of the first set of nanoparticles 138 have a diameter D and some of the first set of nanoparticles 140 have a diameter d (which is smaller than D). Similarly, some of the second set of nanoparticles 142 have a diameter D and some of the second set of nanoparticles 144 have a diameter d (which is smaller than D). The nanoparticles 138, 140, 142, 144 have a random distribution of displacements of adjacent nanoparticles, the displacements of adjacent nanoparticles ranging from a minimum displacement $Q_{min}$ to a maximum displacement $Q_{max}$.

In each of the diffusors 130, 132, 134, the layer of nanoparticles can act as a random array of microlenses, causing scattering of EUV radiation that is incident on the diffusor. The layer of nanoparticles may be considered to form a nanostructure. This is particularly advantageous for use with EUV radiation (which may, for example, have a wavelength of 13.5 nm) because such a nanostructure can comprise features with a dimension that is comparable to, or smaller than, the wavelength of the radiation that it is desired to diffuse. Under these conditions, the scattering is in the Mie-scattering regime, and significant angular dispersion can be achieved.

By arranging the diffusor 130, 132, 134 such that an EUV radiation beam is incident on it at an oblique angle, the amount of dispersion to be tailored for a particular purpose. With such an arrangement, the amount of dispersion will be different in the plane of incidence and in a plane perpendicular to the plane of incidence.

As previously discussed, the diffusor 130, 132, 134 may be used in, or form part of, a measurement system for determining an aberration map or a relative intensity map for a projection system of a lithographic apparatus. In some such systems, the projection system may have an anamorphic design whereby different reduction factors are applied in two orthogonal directions. With such an anamorphic projection system it may be desirable to provide a diffusor 130, 132, 134 which is arranged, for example, to provide more diffusion in one direction and less diffusion in another perpendicular direction. This can be achieved by suitable orientation of the diffusor 130, 132, 134.

In each of the diffusors 130, 132, 134, a ratio of an average dimension of the nanoparticles to an average displacement of adjacent nanoparticles is in the range 1 to 2. It will be appreciated that as used herein a dimension of a nanoparticle may mean a diameter D of that nanoparticle. It will be appreciated that as used herein a displacement of two adjacent nanoparticles may mean a distance Q, in a plane of the diffusor, between a centre of one of the nanoparticles a centre of the other nanoparticle. By arranging the nanoparticles within the layer of nanoparticles such that the ratio of the average dimension $D_{av}$ of the nanoparticles to an average displacement $Q_{av}$ of adjacent nanoparticles is in the range 1 to 2 the diffusor may approximate diffusors that are based on quasi-random diffractive structures (having a range of heights, pitches and/or widths).

The nanoparticles 138, 140, 142, 144 may be formed from any materials with suitable optical properties so as to achieve a desired angular dispersion of EUV radiation passing therethrough.

In some embodiments, the nanoparticles 138, 140, 142, 144 are formed from a noble metal such as ruthenium (Ru) or rhodium (Rh).

Alternatively, the nanoparticles 138, 140, 142, 144 may be formed from yttrium (Y), zirconium (Zr), molybdenum (Mo) or diamond. Alternatively, the nanoparticles 138, 140, 142, 144 may be formed from a ceramic based on any of the following: ruthenium, rhodium, yttrium, zirconium, molybdenum or carbon, in combination with any of the following: boron (B), nitrogen (N), oxygen (O) or carbon (C).

Optionally, for embodiments wherein the nanoparticles 138, 140, 142, 144 are formed from a non-noble metal, that material may be encapsulated in a shell formed from a noble metal such as, for example, ruthenium or rhodium. The thickness of such a shell may be <R/2, where R is the radius of the nanoparticle 138, 140, 142, 144. Such a shell of noble metal improves robustness of the nanoparticles 138, 140, 142, 144 to the environment, which may comprise an EUV plasma.

Optionally, the nanoparticles 138, 140, 142, 144 may comprise an outer shell of material formed from SiO2, ZrO2, Y2O3 or other oxide, boride, nitride, silicide or carbide. The thickness of such a shell may be <R/2, where R is the radius of the nanoparticle 138, 140, 142, 144. This shell can improve colloid solution stability during deposition of the layer of nanoparticles 138, 140, 142, 144.

Optionally, the nanoparticles 138, 140, 142, 144 may be functionalized by one or more polar, non-polar or amphiphilic groups to improves colloid solution stability during deposition of the layer of nanoparticles 138, 140, 142, 144. Suitable groups may include carboxyl groups (—COOH), polyethylene glycol (PEG) groups. Such groups may be chemically linked to the nanoparticles 138, 140, 142, 144 and may help deposition of the layer of nanoparticles 138, 140, 142, 144. Such groups may form a sparse sub-monolayer on the nanoparticles 138, 140, 142, 144.

The nanoparticles 138, 140, 142, 144 may have any suitable dimensions to achieve a desired level of scattering for a desired wavelength. For example, the nanoparticles 138, 140, 142, 144 may have a dimension in the range 10 nm-1 µm.

The nanoparticles 138, 140, 142, 144 may be arranged randomly or quasi-randomly. The particle coverage of the support layer 136 by the layer of nanoparticles 138, 140, 142, 144 may be in the range 50%-500% (i.e. from a sub-monolayer to several monolayers stacked).

The support layer 136 may be formed from a material that has a relatively low absorption coefficient for EUV radiation. The support layer 136 may be formed from a material which is suitable for use in the environment within an EUV lithographic apparatus, which may have a relatively high temperature, and may have a hydrogen plasma (also referred to as an EUV-induced plasma or just an EUV plasma).

The support layer 136 may be formed from a ceramic, the ceramic comprising one of the following metals: molybdenum, zirconium or yttrium in combination with at least one of the following: silicon, carbon, nitrogen or boron. For example, the support layer may be formed from a ceramic comprising one of the following: MoSi, MoSiN, YSiB, SiC, ZrSi, ZrC or MoC. It will be appreciated that as used here, these ceramics are not precise chemical formulae but merely indicate the elements in the ceramic (but not necessarily the ratios of those elements).

Alternatively, the support layer 136 may be formed from graphene or diamond-like carbon.

The support layer 136 may have any suitable thickness to provide sufficient self-support and support for the layer of nanoparticles 138, 140, 142, 144. For example, the support layer 136 may have a thickness of the order of 10 nm-1 µm. For example, in one embodiment the support layer 136 may have a thickness of ~100 nm.

Optionally, the support layer 136 may comprise a cap layer to protect the support layer against EUV plasma etching. The cap layer may comprise a noble metal such as, for example, ruthenium or rhodium. The cap layer may completely encapsulate the bulk of the support layer 136. The cap layer may have a thickness of less than 10 nm, for example less than 5 nm. Optionally, the support layer 136 may further comprise an intermediate layer disposed between the cap layer and a bulk of the support layer 136. The intermediate layer may be arranged to stabilize the cap layer against de-wetting (for example, the intermediate layer may be formed from a suitable material to reduce de-wetting of the cap layer). In use, the diffusor 130, 132, 134 may be at high temperatures, under which conditions the chances of such de-wetting occurring may be increased. The intermediate layer may comprise one of the following: metals: molybdenum, zirconium or yttrium. The intermediate layer may have a thickness of less than 5 nm, for example less than 2 nm.

Figure 14A:
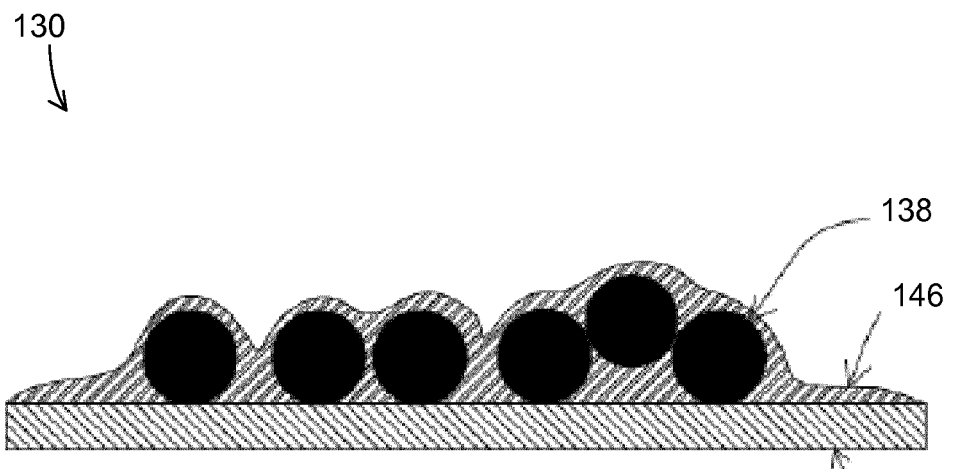
FIG. 14A shows a variant of the diffusor shown in FIG. 13A wherein the diffusor comprises a cover layer which at least partially covers the support layer and/or the layer of nanoparticles.
Figure 14B:
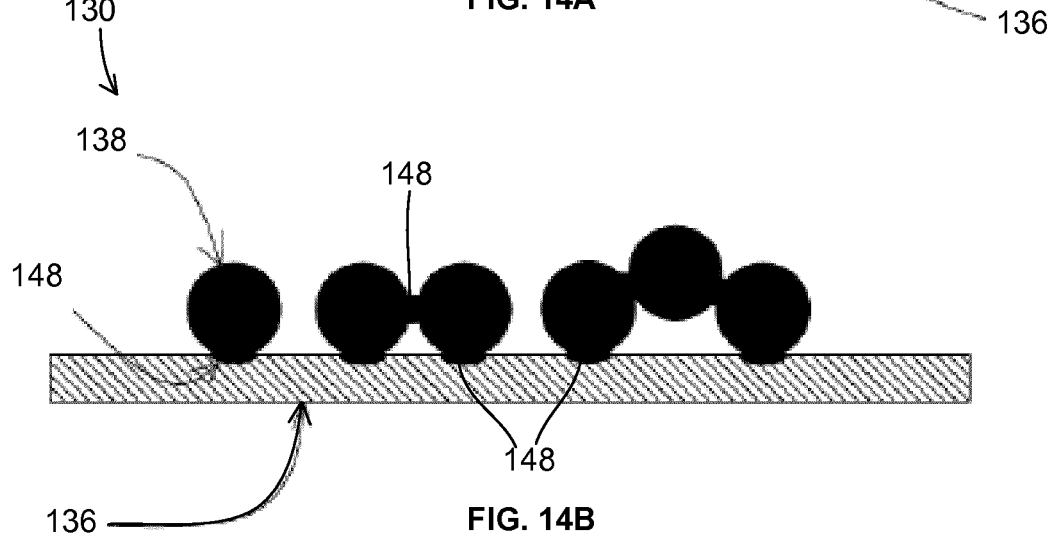
FIG. 14B shows a variant of the diffusor shown in FIG. 13A wherein the layer of nanoparticles has been welded or sintered to the support layer.
Figure 14C:
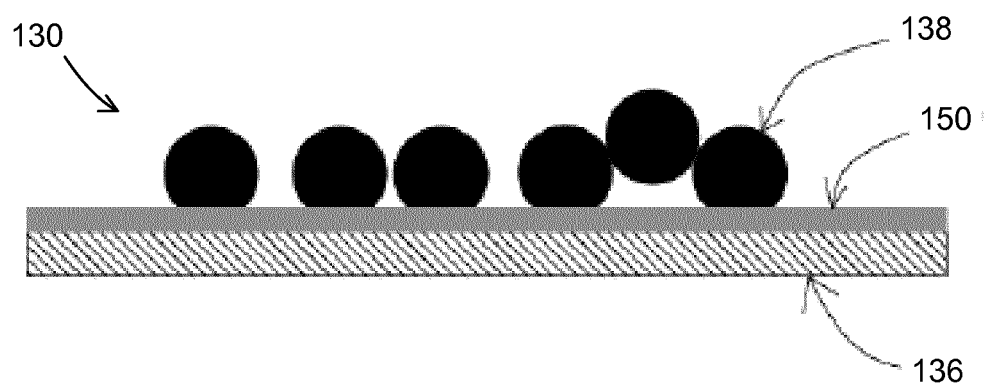
FIG. 14C shows a variant of the diffusor shown in FIG. 13A wherein the layer of nanoparticles has been microbrazed to the support layer via an interior layer between therebetween having a lower melting point than the support layer and the layer of nanoparticles.

In some embodiments, one or more measures may be taken to better adhere the layer of nanoparticles 138, 140, 142, 144 to the support layer 136, as now discussed with reference to FIGS. 14A to 14C. FIGS. 14A to 14C show variants of the diffusor 130 shown in FIG. 13A. However, it will be appreciated that these features may also be provided for diffusors 132, 134 of the type shown in FIGS. 13B and 13C.

As shown schematically in FIG. 14A, the diffusor 130 may further comprise a cover layer 146 which at least partially covers the support layer 136 and/or the layer of nanoparticles 138.

Such a cover layer 146 can help to retain the nanoparticles 138 on the support layer 136. Additionally or alternatively, the support layer 146 can provide some degree of protection for the support layer 136 and/or the layer of nanoparticles 138 from the ambient environment. In use, the ambient environment may be the environment within an EUV lithographic apparatus, which may have a relatively high temperature, and may have a hydrogen plasma.

The cover layer 146 may be formed from a material that is transmissive for EUV radiation. The cover layer 146 may be formed, for example, from ruthenium (Ru) or silicon dioxide ($SiO_2$).

As schematically shown in FIG. 14B, the layer of nanoparticles 138 may be welded or sintered to the support layer 136. It will be appreciated that this may be achieved by heating the support layer 136 and/or the layer of nanoparticles 138 so as to weld or sinter the layer of nanoparticles 138 to the support layer 136. This is shown schematically by deformed portions 148 of the nanoparticles 138 that have been formed by such heating and which act to join the nanoparticles to the support layer 136 (and to each other). This can further enhance the retention of the layer of nanoparticles 138 on the support layer 136. Heating the support layer 136 and/or the layer of nanoparticles 138 may, for example, be achieved via e-beam exposure or heat annealing.

As schematically shown in FIG. 14C, the diffusor 130 may further comprise an interior layer 150 disposed between the support layer 136 and the layer of nanoparticles 138. At least some of the nanoparticles 138 are at least partially embedded in said interior layer 150.

The interior layer 150 may have a lower melting point than the support layer 136 and the layer of nanoparticles 138 and such an arrangement (wherein at least some of the nanoparticles 138 are at least partially embedded in the interior layer 150) may be achieved by heating the interior layer 150 above the melting point of the interior layer 150 and allowing the interior layer 150 to cool so as to braze the support layer 136 to the layer of nanoparticles 138. This can further enhance the retention of the layer of nanoparticles 138 on the support layer 136. Heating the interior layer 150 may, for example, be achieved via e-beam exposure or heat annealing.

Such an interior layer 150 can help to adhere the nanoparticles 138 onto the support layer 136. Such an arrangement may be referred to as a micro-brazed diffusor 130.

The diffusors 130, 132, 134 described above with reference to FIGS. 13A to 14C may be configured such that the angular scattering distribution in at least one scattering direction has a width of 5° or greater.

Generally, the nanoparticles 138, 140, 142, 144 may be formed from materials having a refractive index n such that the magnitude of (1-n) is as larger as possible (for example greater than a threshold value of 0.06). Generally, the nanoparticles 138, 140, 142, 144 may be formed from materials having an extinction coefficient k for EUV radiation which is as small as possible (for example less than a threshold value of 0.04 $nm^{-1}$).

Methods for forming a diffusor 130, 132, 134 of the types described above with reference to FIGS. 13A to 14C are now discussed.

Generally, a method for forming a diffusor 130, 132, 134 of the types described above with reference to FIGS. 13A to 14C comprises: providing the support layer 136 formed from a first material; and depositing a plurality of nanoparticles 138, 140, 142, 144 so as to form the layer of nanoparticles 138, 140, 142, 144 supported by the support layer 136.

Generally, the process of depositing the nanoparticles 138, 140, 142, 144 so as to form the layer of nanoparticles 138, 140, 142, 144 supported by the support layer 136 can result in a randomly or quasi-randomly arrangement of the nanoparticles 138, 140, 142, 144 (which is suitable for use as a diffractor). The method provides an alternative method of production of a diffusor 130, 132, 134 that is cheap, simple and provides large freedom of substrate design for the support layer, so the support layer 136 can be better tailored so as to allow thermal management of the diffusor 130, 132, 134.

For example, another method for forming a quasi-random diffracting structure may be to form a plurality of, for example rectangular, features on a support substrate having a quasi-random distribution of at least one of: height, pitch and/or width (of the types shown in FIGS. 12A and 12B). Such structures require some mechanism to plan a quasi-random structure and then may be fabricated, for example, using lithographic techniques. In contrast, generally processes for depositing a plurality of nanoparticles 138, 140, 142, 144 so as to form a layer of nanoparticles 138, 140, 142, 144 will result in a random or quasi-random structure and are generally cheaper and simpler to execute. Furthermore, by varying properties of the layer of nanoparticles 138, 140, 142, 144 such as, for example, the materials, the sizes, the density of the nanoparticles 138, 140, 142, 144 within the layer the properties of the diffusor 130, 132, 143 can be easily varied.

The plurality of nanoparticles 138, 140, 142, 144 may be deposited onto the support layer 136 using an aerosol or colloid constraining the nanoparticles 138, 140, 142, 144, as now discussed.

In some embodiments, depositing the plurality of nanoparticles 138, 140, 142, 144 so as to form the layer of nanoparticles 138, 140, 142, 144 supported by the support layer 136 may be achieved using aerosol deposition. For example, the deposition may comprise: providing an aerosol comprising the nanoparticles 138, 140, 142, 144 suspended in a carrier gas; and depositing the plurality of nanoparticles 138, 140, 142, 144 from the aerosol so as to form the layer of nanoparticles 138, 140, 142, 144 supported by the support layer 136.

Any suitable carrier gas may be used.

In some embodiments, the aerosol comprising the nanoparticles 138, 140, 142, 144 suspended in a carrier gas may comprise formation of the aerosol using spark ablation. Spark ablation is a known technique for aerosol generation.

Electrodes formed from a conducting material can be used, in combination with a voltage supply, to form nanoparticles 138, 140, 142, 144 of that material via spark ablation. A flow of suitable carrier gas past (or even through) the electrodes can be used to form the aerosol.

For embodiments wherein the aerosol is formed using spark ablation, the carrier gas may, for example, comprise an inert gas. Suitable inert gases may include, for example, noble gases (for example argon) or nitrogen. Such inert gases are beneficial since they can avoid unwanted reactions (for example oxidization) of the nanoparticles.

This aerosol-based method has been successfully used to form a multi-layer layer of nanoparticles on a substrate for nanoparticle sizes up to around 20 nm.

Alternatively, an aerosol comprising the nanoparticles 138, 140, 142, 144 suspended in a carrier gas may be formed by forming of a colloid comprising the nanoparticles suspended in a carrier liquid and forming a vapour from the colloid. For such embodiments (wherein the aerosol is formed by forming a vapour from a colloid), the carrier gas may be a gas formed from a carrier liquid of the colloid (which may be referred to as the carrier fluid). The carrier gas or carrier liquid may be selected to ensure that the colloid and/or the aerosol are stable. The carrier fluid may be selected to ensure that the carrier fluid can evaporate fully such that no molecular residuals from the carrier fluid are left after formation of the layer of nanoparticles 138, 140, 142, 144. Generally, either a polar (for example water) carrier fluid or a non-polar (for example heptane or hexane) carrier fluid may be used.

Depositing the plurality of nanoparticles 138, 140, 142, 144 from the aerosol on to the support layer 136 may be achieved via impaction and/or diffusion. Impaction may be achieved by directing the aerosol at the support layer 136.

Alternatively, the plurality of nanoparticles 138, 140, 142, 144 may be deposited on to the support layer 136 may be achieved using direct ("wet") colloid deposition. For example, a colloid comprising the nanoparticles 138, 140, 142, 144 suspended in a carrier liquid may be formed and then deposited directly onto the support layer 136. Subsequently, the carrier liquid can be removed via evaporation so as to deposit the plurality of nanoparticles 138, 140, 142, 144 from the colloid so as to form the layer of nanoparticles 138, 140, 142, 144 supported by the support layer 136.

For example, droplets of the colloid can be deposited onto the support layer 136 (or an intermediate layer if used) and allowed to dry. As the carrier liquid evaporates, the nanoparticles 138, 140, 142, 144 remain on the support layer 136. The colloid droplets may have any suitable size (for example the droplets may have a volume of the order of 1 µL). The colloid may have any suitable concentration of nanoparticles 138, 140, 142, 144 (for example the droplets may have a concentration of the order of $\sim 10^{10}$-$10^{12}$ parts/µL).

A drying pattern from such a process can result in a sparse monolayer and/or a few monolayers. A random deposition pattern suitable for the diffusors 130, 132, 134 can be achieved, for example, by using a poly-disperse colloid and/or a colloid comprising a mix of different shapes and/or materials. The colloid may be a poly-disperse colloid. This may result in a random deposition pattern suitable for the diffusor 130, 132, 134.

Such colloid-based wet synthesis methods have been successfully used to deposit silver, gold and platinum nanoparticles (for example having sizes of the order of 70 nm). Similar techniques can be used by to deposit nanoparticles formed from, for example, ruthenium or rhodium.

Any suitable carrier liquid may be used. The carrier liquid may be selected to ensure that the colloid remains stable (i.e. such that the nanoparticles 138, 140, 142, 144 remain dispersed and do not dissolve and/or agglomerate). The carrier liquid may be selected to ensure that the carrier fluid can evaporate fully such that no molecular residuals from the carrier liquid are left after formation of the layer of nanoparticles 138, 140, 142, 144. Generally, either a polar (for example water) carrier fluid or a non-polar (for example heptane or hexane) carrier fluid may be used. It will be apparent to the skilled person which carrier fluids may be appropriate for a given type of nanoparticles 138, 140, 142, 144.

The method of forming the diffusor 130, 132, 134 may further comprise back-etching of the support layer 136 (i.e. etching a surface of the support layer 136 that is opposite to a surface of the support layer 136 supporting the layer of nanoparticles 138, 140, 142, 144) once the layer of nanoparticles 138, 140, 142, 144 has been formed on the support layer 136. This back-etching of the support layer 136 allows a thicker, more stable support layer to be used during the deposition of the nanoparticles 138, 140, 142, 144. Advantageously, this can prevent damage, or even rupture, of the support layer 136. This final etching step may be particularly beneficial for embodiments wherein the nanoparticles 138, 140, 142, 144 are deposited using a colloid since it can to prevent capillary forces from braking the support layer 136. Once the layer of nanoparticles 138, 140, 142, 144 has been formed, the thickness of this support layer 136 can be finalized using the etching process.

The method of forming the diffusor 130, 132, 134 may further comprise implementing one of the above-described measures for better adhering the layer of nanoparticles 138, 140, 142, 144 to the support layer 136, as discussed above with reference to FIGS. 14A to 14C. For example, the method may further comprise providing a cover layer 146 which at least partially covers the support layer 136 and/or the layer of nanoparticles 138 (see FIG. 14A). Additionally or alternatively, the method may further comprise welding or sintering the nanoparticles 138, 140, 142, 144 to the support layer 136 (see FIG. 14B). This may be achieved by heating the support layer 136 and/or the layer of nanoparticles 138 so as to weld or sinter the layer of nanoparticles 138 to the support layer 136 (for example, using e-beam exposure or heat annealing). Additionally or alternatively, at least some of the nanoparticles 138 may be at least partially embedded in an interior layer 150 (see FIG. 14C). This may be achieved by heating the interior layer 150 above the melting point of the interior layer 150 and allowing the interior layer 150 to cool so as to braze the support layer 136 to the layer of nanoparticles 138. Heating the interior layer 150 may, for example, be achieved via e-beam exposure or heat annealing.

According to some embodiments of the present invention, there is provided a measurement system for determining an aberration map or relative intensity map for a projection system PS comprising one of the above described diffusors. According to some embodiments of the present invention, there is provided a lithographic apparatus comprising such a measurement system.

In use, the diffusor (for example comprising at least one diffusor 50 of the type shown in FIGS. 5A and 5B or a diffusor 114 of the type shown in FIG. 11 or a diffusor 130, 132, 134 of the type shown in FIGS. 13A to 14C) is disposed such that it can be moved into and out of the optical path of radiation between the illumination system IL and the projection system PS. Such an optical apparatus provides control over the angular distribution of radiation in field planes of the lithographic apparatus LA that are downstream of the apparatus. Such field planes include the plane of the support structure MT (i.e. the plane of a patterning device MA) and the plane of the substrate table WT (i.e. the plane of a substrate W). In order to ensure that the diffusor can be moved into and out of the optical path of radiation between the illumination system IL and the projection system PS, the diffusor may be mounted on a patterning device masking blade of the lithographic apparatus LA, as now discussed.

The lithographic apparatus LA is provided with four reticle masking blades, which define the extent of the field on the patterning device MA which is illuminated. The illumination system IL is operable to illuminate a generally rectangular region of an object disposed on the support structure MT (for example a patterning device MA). This generally rectangular region may be referred to as the slit of the illumination system IL and is defined by four reticle masking blades. The extent of the generally rectangular region in a first direction, which may be referred to as the x direction, is defined by a pair of x masking blades. The extent of the generally rectangular region in a second direction, which may be referred to as the y direction, is defined by a pair of y masking blades.

Each of the masking blades is disposed close to, but slightly out of the plane of the support structure MT. The x masking blades are disposed in a first plane and the y masking blades are disposed in a second plane.

Each of the masking blades defines one edge of a rectangular field region in the plane of the object which receives radiation. Each blade may be independently movable between a retracted position wherein it is not disposed in the path of the radiation beam and an inserted position wherein it at least partially blocks the radiation beam projected onto the object. By moving the masking blades into the path of the radiation beam, the radiation beam B can be truncated (in the x and/or y direction) thus limiting the extent of the field region which receives radiation beam B.

The x direction may correspond to a non-scanning direction of the lithographic apparatus LA and the y direction may correspond to a scanning direction of the lithographic apparatus LA. That is, the object (and a substrate W in the image plane) may be movable in the y-direction through the field region so as to expose a greater target region of the object (and the substrate W) in a single dynamic scanning exposure. During such a dynamic scanning exposure the y masking blades are moved to control the field region so as to ensure that no parts of the substrate W outside of a target region are exposed. At the start of the scanning exposure one of the y masking blades is disposed in the path of the radiation beam B, acting as a shutter, such that no part of the substrate W receives radiation. At the end of the scanning exposure the other y masking blade is disposed in the path of the radiation beam B, acting as a shutter, such that no part of the substrate W receives radiation.

The diffusor (for example comprising at least one diffusor 50 of the type shown in FIGS. 5A and 5B or a diffusor 114 of the type shown in FIG. 11 or a diffusor 130, 132, 134 of the type shown in FIGS. 13A to 14C) may be mounted on a patterning device masking blade of the lithographic apparatus LA. In particular, the diffusor may be positioned such that it is not generally disposed in the path of the radiation beam when the masking blades are disposed in a position within their nominal movement ranges during a scanning exposure.

The diffusor (for example comprising at least one diffusor 50 of the type shown in FIGS. 5A and 5B or a diffusor 114 of the type shown in FIG. 11 or a diffusor 130, 132, 134 of the type shown in FIGS. 13A to 14C) may have any of the following properties. The diffusor may result in an angular scattering distribution in at least one scattering direction having a width of 5° to 10° or greater. The diffusor may result in a uniform or Gaussian angular power distribution (as a function of scattering angle). The diffusor may have an absorption for EUV radiation of less than 90%, for example less than 50% (for a single pass). The diffusor may have a lifetime more than 7 years in a lithographic apparatus (for example with an illumination duty cycle of the order of ~0.1-1%). The diffusor may be operable to survive an un-attenuated EUV power density of the order of 1 to 10 W/cm$^2$. The diffusor may have dimensions of the order of ~1 to 3 mm$^2$×1 to 3 mm$^2$.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Embodiments are provided according to the following clauses:

1. A diffusor configured to receive and transmit radiation, wherein the diffusor comprises: a plurality of layers, each layer arranged to change an angular distribution of radiation passing through it differently.
2. The diffusor of clause 1, wherein at least two of the plurality of layers predominantly cause angular dispersion of EUV radiation passing through it in a single scattering direction in a plane of the diffusor, the scattering directions of the at least two layers being different.
3. The diffusor of clause 2, wherein at least two of the plurality of layers causes different amounts of angular dispersion of EUV radiation passing through them in their respective scattering directions.
4. The diffusor of any of clauses 1 to 3, wherein at least one of the plurality of layers comprises a layer of scattering material with a nanostructure provided on at least one surface thereof.
5. The diffusor of clause 4, wherein the nanostructure comprises features with a dimension in the range 2-10 nm.
6. The diffusor of any of clauses 1 to 5, configured such that the angular scattering distribution in at least one scattering direction has a width of 5° or greater.
7. The diffusor of any of clauses 4 to 6, wherein the scattering material has a refractive index n and wherein the magnitude of (1×n) is greater than a threshold value of 0.06.
8. The diffusor of any of clauses 4 to 7, wherein the scattering material has an extinction coefficient k for EUV radiation less than a threshold value of 0.04 nm$^{-1}$.

9. The diffusor of any of clauses 4 to 8, wherein the scattering material has a refractive index n and an extinction coefficient k for EUV radiation and wherein the ratio of the magnitude of (1×n) to (k+0.025) is greater than a threshold value of 2.
10. The diffusor of any of clauses 4 to 9, wherein the scattering material comprises one of the following: molybdenum, ruthenium, niobium, rhodium or technetium.
11. The diffusor of any of clauses 4 to 10, wherein the scattering material has a thickness arranged to cause a phase shift of (2m+1) π radians for EUV radiation propagating across the thickness of the scattering material.
12. The diffusor of any of clauses 4 to 11, wherein the layer of scattering material is adjacent a layer of support material, the support material having a nanostructure provided on at least one surface thereof.
13. The diffusor of clause 12, wherein the layer of support material comprises a membrane formed from carbon nanotubes.
14. The diffusor of clause 12, wherein the layer of support material comprises porous silicon.
15. A diffusor configured to receive and transmit radiation, wherein the diffusor comprises: a first layer formed from a first material, the first layer comprising a nanostructure on at least one surface of the first layer; and a second layer formed from a second material adjacent to the at least one surface of the first layer such that the second layer also comprises a nanostructure, the second material having a refractive index that is different to a refractive index of the first layer.
16. The diffusor of clause 15, wherein the nanostructure comprises features with a dimension in the range 2-10 nm.
17. The diffusor of clause 15 or clause 16, configured such that the angular scattering distribution in at least one scattering direction has a width of 5° or greater.
18. The diffusor of any of clauses 15 to 17, wherein the first layer comprises a membrane formed from carbon nanotubes.
19. The diffusor of any of clauses 15 to 17 wherein the first layer comprises porous silicon.
20. The diffusor of any of clauses 15 to 17 wherein the first layer comprises a support material which has been selectively etched to form the nanostructure.
21. The diffusor of clause 20, wherein a layer of metal is provided on parts of the support material which have not been selectively etched.
22. The diffusor of any of clauses 15 to 21, wherein the second material has a refractive index n and wherein the magnitude of (1×n) is greater than a threshold value of 0.06.
23. The diffusor of any of clauses 15 to 22, wherein the second material has an extinction coefficient k for EUV radiation less than a threshold value of 0.04 nm⁻1.
24. The diffusor of any of clauses 15 to 23, wherein the second material has a refractive index n and an extinction coefficient k for EUV radiation and wherein the ratio of the magnitude of (1−n) to (k+0.025) is greater than a threshold value of 2.
25. The diffusor of any of clauses 15 to 24, wherein the second material comprises one of the following: molybdenum, ruthenium, niobium, rhodium or technetium.
26. The diffusor of any of clauses 15 to 25, wherein the diffusor has a thickness arranged to cause a phase shift of (2m+1) π radians for EUV radiation propagating across the thickness of the diffusor.
27. A diffusor configured to receive and transmit EUV radiation, wherein the diffusor comprises: a support layer formed from a first material; and a layer of nanoparticles supported by the support layer, the nanoparticles being formed from a material that is transmissive for EUV radiation and causes refraction of EUV radiation incident on the diffusor.
28. The diffusor of clause 27, wherein a ratio of an average dimension of the nanoparticles to an average displacement of adjacent nanoparticles is in the range 1 to 2.
29. The diffusor of clause 27 or clause 28, wherein the nanoparticles may comprise a noble metal such as ruthenium (Ru) or rhodium (Rh).
30. The diffusor of any of clauses 27 to 29, wherein the nanoparticles comprise an outer shell of material formed from SiO2, ZrO2, Y2O3 or other oxide, boride, nitride, silicide or carbide.
31. The diffusor of any of clauses 27 to 29, wherein the nanoparticles are functionalized by polar, non-polar or amphiphilic groups to improves colloid solution stability during deposition of the layer of nanoparticles.
32. The diffusor of any of clauses 27 to 31 wherein the nanoparticles have a dimension in the range 10 nm-1 μm.
33. The diffusor of any of clauses 27 to 32, wherein the nanoparticles are arranged randomly or quasi-randomly.
34. The diffusor of any of clauses 27 to 33, wherein the nanoparticles are formed from a plurality of different materials.
35. The diffusor of any of clauses 27 to 34, wherein the support layer is formed from a ceramic, the ceramic comprising one of the following metals: molybdenum, zirconium or yttrium in combination with at least one of the following: silicon, carbon, nitrogen or boron.
36. The diffusor of any of clauses 27 to 35, wherein the support layer is formed from graphene or diamond-like carbon.
37. The diffusor of any of clauses 27 to 36, wherein the support layer has a thickness of the order of 10 nm-1 μm.
38. The diffusor of any of clauses 27 to 37, wherein the support layer comprises a cap layer to protect the support layer against EUV plasma etching.
39. The diffusor of clause 38, wherein the support layer comprises an intermediate layer disposed between the cap layer and a bulk of the support layer, wherein the intermediate layer is arranged to stabilize the cap layer against de-wetting.
40. The diffusor of any of clauses 27 to 39, wherein the diffusor further comprises a cover layer which at least partially covers the support layer and/or the layer of nanoparticles.
41. The diffusor of any of clauses 27 to 40, wherein the diffusor further comprises an interior layer disposed between the support layer and the layer of nanoparticles and wherein at least some of the nanoparticles are at least partially embedded in said interior layer.
42. The diffusor of any of clauses 27 to 41, configured such that the angular scattering distribution in at least one scattering direction has a width of 5° or greater.
43. The diffusor of any of clauses 27 to 42, wherein the nanoparticles are formed from a material having a refractive index n and wherein the magnitude of (1−n) is greater than a threshold value of 0.06.
44. The diffusor of any of clauses 27 to 43, wherein the nanoparticles are formed from a material having an extinction coefficient k for EUV radiation less than a threshold value of 0.04 nm$^{-1}$.
45. The diffusor of any of clauses 27 to 44, wherein the material from which the nanoparticles are formed has a refractive index n and an extinction coefficient k for EUV radiation and wherein the ratio of the magnitude of (1−n) to the extinction coefficient k for EUV radiation is greater than a threshold value of 3.5.
46. The diffusor of any of clauses 1 to 45, wherein a transmissivity of the diffusor for EUV radiation is greater than 50%.
47. A measurement system for determining an aberration map or relative intensity map for a projection system comprising the diffusor of any of clauses 1 to 46.
48. The measurement system of clause 47, comprising: a patterning device; an illumination system arranged to illuminate the patterning device with radiation; and a sensor apparatus, wherein the illumination system and patterning device are configured such that the projection system receives at least a portion of the radiation scattered by the patterning device and the sensor apparatus is configured such that the projection system projects the received radiation onto the sensor apparatus; and wherein the diffusor is operable to receive the radiation produced by the illumination system and to alter an angular distribution of the radiation before it illuminates the patterning device.
49. The measurement system of clause 48, wherein the diffusor is moveable between at least: a first, operating position wherein the diffusor is at least partially disposed in a path of the radiation produced by the illumination system and is arranged to alter an angular distribution of the radiation before it illuminates the patterning device; and a second, stored position wherein the diffusor is disposed out of the path of the radiation produced by the illumination system.
50. A lithographic apparatus comprising: the measurement system of any of clauses 47 to 49; and a projection system configured to receive at least a portion of the radiation scattered by the patterning device and configured to project the received radiation onto the sensor apparatus.
51. The lithographic apparatus of clause 50, wherein the diffusor is mounted on a patterning device masking blade of the lithographic apparatus, an edge of the patterning device masking blades defining a field region of the lithographic apparatus.
52. A method of forming a diffusor according to any of clauses 15 to 26, the method comprising: forming the first layer from the first material, the first layer comprising a nanostructure on at least one surface of the first layer; and forming the second layer from the second material on the at least one surface of the first layer.
53. The method of clause 52, wherein forming the first layer comprises: providing a layer of support material; forming a self-assembled metal structure on a surface of the layer of support material; and selectively etching parts of the layer of support material that are not in contact with the self-assembled metal structure.
54. The method of clause 53, wherein the layer of support material is formed on a carrier layer, which acts to support the layer of support material while the diffusor is being formed and wherein the method further comprises removing said carrier layer once the first and second layers have been formed.
55. A method of forming a diffusor according to any of clauses 27 to 45, the method comprising: providing the support layer formed from the first material; and depositing a plurality of nanoparticles so as to form the layer of nanoparticles supported by the support layer.
56. The method of clause 55, wherein depositing the plurality of nanoparticles so as to form the layer of nanoparticles supported by the support layer is achieved using aerosol deposition and comprises: providing an aerosol comprising the nanoparticles suspended in a carrier gas; and depositing the plurality of nanoparticles from the aerosol so as to form the layer of nanoparticles supported by the support layer.
57. The method of clause 56, wherein providing an aerosol comprising the nanoparticles suspended in a carrier gas comprises formation of the aerosol using spark ablation.
58. The method of clause 56, wherein providing an aerosol comprising the nanoparticles suspended in a carrier gas comprises formation of a colloid comprising the nanoparticles suspended in a carrier liquid and forming a vapour from the colloid.
59. The method of any of clauses 56 to 58, wherein depositing the plurality of nanoparticles from the aerosol so as to form the layer of nanoparticles supported by the support layer is achieved via impaction and/or diffusion.
60. The method of clause 55, wherein depositing the plurality of nanoparticles so as to form the layer of nanoparticles supported by the support layer is achieved using colloid deposition and comprises: providing a colloid comprising the nanoparticles suspended in a carrier liquid; depositing the colloid on the support layer; and removing the carrier liquid via evaporation so as to deposit the plurality of nanoparticles from the colloid so as to form the layer of nanoparticles supported by the support layer.
61. The method of any of clauses 55 to 60, further comprising heating the support layer and/or the layer of nanoparticles so as to weld or sinter the layer of nanoparticles to the support layer.
62. The method of any of clauses 55 to 60, wherein the diffusor further comprises an interior layer disposed between the support layer and the layer of nanoparticles, the interior layer having a lower melting point than the support layer and the layer of nanoparticles, and wherein the method further comprises heating the interior layer above the melting point of the interior layer and allowing the interior layer to cool so as to braze the support layer to the layer of nanoparticles.
63. The method of any of clauses 55 to 62, further comprising etching the support layer from a surface of the support layer that is opposite to a surface of the support layer supporting the layer of nanoparticles once the plurality of nanoparticles have been deposited so as to form the layer of nanoparticles supported by the support layer.
64. The method of any of clauses 55 to 63, further comprising providing a cover layer which at least partially covers the support layer and/or the layer of nanoparticles.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A diffusor configured to receive and transmit EUV radiation, the diffusor comprising a plurality of layers, each layer arranged to change an angular distribution of the EUV radiation passing through it differently than another layer of the plurality of layers, wherein each of at least two of the plurality of layers cause angular dispersion of EUV radiation passing through it in a predominant scattering direction in a plane of the diffusor, the predominant scattering directions of the at least two layers being different.

2. The diffusor of claim 1, wherein each of at least two of the plurality of layers causes a different amount of angular dispersion of EUV radiation passing through it in its respective predominant scattering direction than that of another layer of the plurality of layers.

3. The diffusor of claim 1, wherein at least one of the plurality of layers comprises a layer of scattering material with a nanostructure provided on at least one surface thereof.

4. The diffusor of claim 3, wherein:
the scattering material has a refractive index n and the magnitude of (1−n) is greater than a threshold value of 0.06, and/or
the scattering material has an extinction coefficient k for EUV radiation less than a threshold value of 0.04 nm$^{-1}$.

5. The diffusor of claim 3, wherein the scattering material has a refractive index n and an extinction coefficient k for EUV radiation and wherein the ratio of the magnitude of (1−n) to (k+0.025) is greater than a threshold value of 2.

6. The diffusor of claim 3, wherein the scattering material has a thickness arranged to cause a phase shift of (2m+1) π radians for EUV radiation propagating across the thickness of the scattering material.

7. The diffusor of claim 3, wherein the layer of scattering material is adjacent a layer of support material, the support material having a nanostructure on at least one surface thereof.

8. The diffusor of claim 7, wherein the layer of support material comprises a membrane formed from carbon nanotubes and/or wherein the layer of support material comprises porous silicon.

9. The diffusor of claim 3, wherein the scattering material comprises molybdenum, ruthenium, niobium, rhodium or technetium.

10. The diffusor of claim 1, configured such that the angular distribution in at least one scattering direction has a width of 5° or greater.

11. A diffusor configured to receive and transmit EUV radiation, the diffusor comprising:
a first layer formed from a first material, the first layer comprising a nanostructure on at least one surface of the first layer, wherein the nanostructure comprises features with a dimension in the range of 2-10 nm; and
a second layer formed from a second material adjacent to the at least one surface of the first layer such that the second layer also comprises a nanostructure, the second material having a refractive index for the EUV radiation that is different to a refractive index for the EUV radiation of the first layer.

12. The diffusor of claim 11, wherein an angular scattering distribution in at least one scattering direction has a width of 5° or greater.

13. The diffusor of claim 11, wherein the first layer comprises a membrane formed from carbon nanotubes and/or wherein the first layer comprises porous silicon.

14. The diffusor of claim 11, wherein the first layer comprises a support material which has been selectively etched to form the nanostructure, wherein a layer of metal is provided on parts of the support material which have not been selectively etched.

15. The diffusor of claim 11, wherein the second material has a refractive index n and the magnitude of (1−n) is greater than a threshold value of 0.06, and/or wherein the second material has an extinction coefficient k for EUV radiation less than a threshold value of 0.04 nm$^{-1}$.

16. The diffusor of claim 11, wherein the second material has a refractive index n and an extinction coefficient k for EUV radiation and wherein the ratio of the magnitude of (1−n) to (k+0.025) is greater than a threshold value of 2.

17. The diffusor of claim 11, wherein the second material comprises molybdenum, ruthenium, niobium, rhodium or technetium.

18. The diffusor of claim 11, wherein the diffusor has a thickness arranged to cause a phase shift of (2m+1) π radians for EUV radiation propagating across the thickness of the diffusor.

19. A diffusor configured to receive and transmit EUV radiation, the diffusor comprising:
a support layer formed from a first material; and
a layer of nanoparticles supported by the support layer, the nanoparticles being formed from a material that is transmissive for EUV radiation and causes refraction of EUV radiation incident on the diffusor,
wherein the diffusor is configured such that an angular scattering distribution in at least one scattering direction has a width of 5° or greater.

20. The diffusor of claim 19, wherein a ratio of an average dimension of the nanoparticles to an average displacement of adjacent nanoparticles is in the range of 1 to 2.

21. The diffusor of claim 19, wherein the nanoparticles comprise a noble metal and/or wherein the nanoparticles comprise an outer shell of material formed from $SiO_2$, $ZrO_2$, $Y_2O_3$ or other oxide, boride, nitride, silicide or carbide.

22. The diffusor of claim 19, wherein the nanoparticles are functionalized by polar, non-polar or amphiphilic groups to improve colloid solution stability during deposition of the layer of nanoparticles.

23. The diffusor of claim 19, wherein the nanoparticles have a dimension in the range of 10 nm-1 μm and/or wherein the nanoparticles are arranged randomly or quasi-randomly.

24. The diffusor of claim 19, wherein:
the nanoparticles are formed from a plurality of different materials; and/or
the support layer is formed from a ceramic, the ceramic comprising molybdenum, zirconium or yttrium in combination with at least one selected from: silicon, carbon, nitrogen or boron.

25. The diffusor of claim 19, wherein the support layer is formed from graphene or diamond-like carbon.

26. The diffusor of claim 19, wherein the support layer has a thickness of the order of 10 nm-1 μm and/or wherein the support layer comprises a cap layer to protect the support layer against EUV plasma etching.

27. The diffusor of claim 19, wherein the diffusor further comprises a cover layer which at least partially covers the support layer and/or the layer of nanoparticles and/or wherein the diffusor further comprises an interior layer disposed between the support layer and the layer of nanoparticles and at least some of the nanoparticles are at least partially embedded in the interior layer.

28. The diffusor of claim 19, wherein:
the nanoparticles are formed from a material having a refractive index n and the magnitude of (1−n) is greater than a threshold value of 0.06; and/or
the nanoparticles are formed from a material having an extinction coefficient k for EUV radiation less than a threshold value of 0.04 $nm^{-1}$.

29. The diffusor of claim 19, wherein:
the material from which the nanoparticles are formed has a refractive index n and an extinction coefficient k for EUV radiation and the ratio of the magnitude of (1−n) to the extinction coefficient k for EUV radiation is greater than a threshold value of 3.5; and/or
a transmissivity of the diffusor for EUV radiation is greater than 50%.

* * * * *